(12) United States Patent
Collins et al.

(10) Patent No.: US 7,465,478 B2
(45) Date of Patent: *Dec. 16, 2008

(54) PLASMA IMMERSION ION IMPLANTATION PROCESS

(75) Inventors: Kenneth S. Collins, San Jose, CA (US); Hiroji Hanawa, Sunnyvale, CA (US); Kartik Ramaswamy, San Jose, CA (US); Andrew Nguyen, San Jose, CA (US); Amir Al-Bayati, San Jose, CA (US); Biagio Gallo, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 21 days.

This patent is subject to a terminal disclaimer.

(21) Appl. No.: 11/046,660

(22) Filed: Jan. 28, 2005

(65) Prior Publication Data

US 2006/0081558 A1  Apr. 20, 2006

Related U.S. Application Data

(63) Continuation-in-part of application No. 10/929,104, filed on Aug. 26, 2004, now abandoned, and a continuation-in-part of application No. 10/838,052, filed on May 3, 2004, now Pat. No. 7,223,676, which is a continuation-in-part of application No. 10/786,410, filed on Feb. 24, 2004, now Pat. No. 6,893,907, which is a continuation-in-part of application No. 10/646,533, filed on Aug. 22, 2003, which is a continuation-in-part of application No. 10/164,327, filed on Jun. 5, 2002, now Pat. No. 6,939,434, which is a continuation-in-part of application No. 09/636,435, filed on Aug. 11, 2000, now Pat. No. 6,494,986.

(51) Int. Cl.
*C23C 14/48* (2006.01)
*B05D 3/06* (2006.01)
*H05H 1/24* (2006.01)
*H05H 1/46* (2006.01)
*H05H 1/02* (2006.01)

(52) U.S. Cl. .............. 427/523; 427/526; 427/527; 427/530; 427/563; 427/562; 427/564; 427/569; 427/570; 427/578; 427/574; 427/573; 427/534; 427/490; 438/766; 438/906

(58) Field of Classification Search ................ None
See application file for complete search history.

(56) References Cited

U.S. PATENT DOCUMENTS 2,344,138 A   3/1944   Drummond ............... 117/107

(Continued)

FOREIGN PATENT DOCUMENTS

EP      0 546 852 A1      6/1993

(Continued)

OTHER PUBLICATIONS

Van de Ven, Evert P., Connick, I-Wen, and Harrus, Alain S., "Advantages of Dual Frequency PECVD for Deposition of ILD and Passivation Films", *IEEE*, Proceedings of VMIC Conference, Jun. 12-13, 1990, pp. 194-201.

(Continued)

*Primary Examiner*—Marianne L Padgett
(74) *Attorney, Agent, or Firm*—Law Office of Robert M. Wallace

(57) ABSTRACT

A method of processing a workpiece includes placing the workpiece on a workpiece support pedestal in a main chamber with a gas distribution showerhead, introducing a process gas into a remote plasma source chamber and generating a plasma in the remote plasma source chamber, transporting plasma-generated species from the remote plasma source chamber to the gas distribution showerhead so as to distribute the plasma-generated species into the main chamber through the gas distribution showerhead, and applying plasma RF power into the main chamber.

18 Claims, 14 Drawing Sheets

U.S. PATENT DOCUMENTS

| | | | |
|---|---|---|---|
| 3,109,100 A | 10/1963 | Gecewicz | 250/219 |
| 3,576,685 A | 4/1971 | Swann et al. | 148/187 |
| 3,907,616 A | 9/1975 | Wiemer | 148/188 |
| 4,116,791 A | 9/1978 | Zega | 204/192 |
| 4,176,003 A | 11/1979 | Brower et al. | 430/313 |
| 4,382,099 A | 5/1983 | Legge et al. | 427/34 |
| 4,385,946 A | 5/1983 | Finegan et al. | 148/175 |
| 4,434,036 A | 2/1984 | Hoerschelmann et al. | 204/164 |
| 4,465,529 A | 8/1984 | Arima et al. | 148/188 |
| 4,481,229 A | 11/1984 | Suzuki et al. | 427/38 |
| 4,500,563 A | 2/1985 | Ellenberger et al. | 427/38 |
| 4,521,441 A | 6/1985 | Flowers | 427/38 |
| 4,539,217 A | 9/1985 | Farley | 427/10 |
| 4,565,588 A | 1/1986 | Seki et al. | 148/186 |
| 4,579,618 A | 4/1986 | Celestino et al. | 156/345 |
| 4,584,026 A | 4/1986 | Wu et al. | 148/1.5 |
| 4,698,104 A | 10/1987 | Barker et al. | 437/141 |
| 4,764,394 A * | 8/1988 | Conrad | 427/525 |
| 4,778,561 A | 10/1988 | Ghanbari | 156/643 |
| 4,867,859 A | 9/1989 | Harada et al. | 304/298 |
| 4,871,421 A | 10/1989 | Ogle et al. | 156/643 |
| 4,892,753 A | 1/1990 | Wang et al. | 427/38 |
| 4,897,171 A * | 1/1990 | Ohmi | 204/298.15 |
| 4,912,065 A | 3/1990 | Mizuno et al. | 437/141 |
| 4,937,205 A | 6/1990 | Nakayama et al. | 437/165 |
| 4,948,458 A | 8/1990 | Ogle | 156/643 |
| 5,040,046 A | 8/1991 | Chhabra et al. | 357/54 |
| 5,061,838 A | 10/1991 | Lane et al. | 219/121.59 |
| 5,074,456 A | 12/1991 | Degner et al. | 228/121 |
| 5,106,827 A | 4/1992 | Borden et al. | 505/1 |
| 5,107,201 A | 4/1992 | Ogle | 324/72.5 |
| 5,218,179 A * | 6/1993 | Matossian et al. | 219/121.43 |
| 5,229,305 A | 7/1993 | Baker | 437/11 |
| 5,248,636 A * | 9/1993 | Davis et al. | 438/709 |
| 5,270,250 A | 12/1993 | Murai et al. | 437/165 |
| 5,277,751 A | 1/1994 | Ogle | 156/643 |
| 5,288,650 A | 2/1994 | Sandow | 437/24 |
| 5,290,382 A | 3/1994 | Zarowin et al. | 156/345 |
| 5,312,778 A | 5/1994 | Collins et al. | 437/225 |
| 5,354,381 A | 10/1994 | Sheng | 118/723 |
| 5,405,492 A * | 4/1995 | Moslehi | 438/694 |
| 5,423,945 A | 6/1995 | Marks et al. | 156/662.1 |
| 5,435,881 A | 7/1995 | Ogle | 156/345 |
| 5,453,305 A * | 9/1995 | Lee | 427/562 |
| 5,505,780 A | 4/1996 | Dalvie et al. | 118/723 |
| 5,510,011 A | 4/1996 | Okamura et al. | 204/192.3 |
| 5,514,603 A | 5/1996 | Sato | 437/16 |
| 5,520,209 A | 5/1996 | Goins et al. | 137/246 |
| 5,542,559 A | 8/1996 | Kawakami et al. | 216/67 |
| 5,561,072 A | 10/1996 | Saito | 437/24 |
| 5,569,363 A | 10/1996 | Bayer et al. | 204/192.32 |
| 5,572,038 A | 11/1996 | Sheng et al. | 250/492.21 |
| 5,587,038 A | 12/1996 | Cecchi et al. | 156/345 |
| 5,625,526 A | 4/1997 | Watanabe et al. | 361/234 |
| 5,627,435 A | 5/1997 | Jansen et al. | 315/111.21 |
| 5,643,838 A | 7/1997 | Dean et al. | 437/237 |
| 5,648,701 A | 7/1997 | Hooke et al. | 315/111.21 |
| 5,653,811 A | 8/1997 | Chan | 118/723 |
| 5,654,043 A | 8/1997 | Shao et al. | 427/527 |
| 5,660,895 A | 8/1997 | Lee et al. | 427/579 |
| 5,665,640 A | 9/1997 | Foster et al. | 438/680 |
| 5,674,321 A | 10/1997 | Pu et al. | 118/723 |
| 5,683,517 A | 11/1997 | Shan | 118/723 |
| 5,711,812 A | 1/1998 | Chapek et al. | 118/723 |
| 5,718,798 A | 2/1998 | Deregibus | 156/429 |
| 5,761,023 A | 6/1998 | Lue et al. | 361/234 |
| 5,770,982 A | 6/1998 | Moore | 333/32 |
| 5,810,933 A | 9/1998 | Mountsier et al. | 118/724 |
| 5,885,358 A | 3/1999 | Maydan et al. | 118/723 |
| 5,888,413 A | 3/1999 | Okumura et al. | 216/68 |
| 5,897,713 A | 4/1999 | Tomioka et al. | 118/723 |
| 5,897,752 A | 4/1999 | Hong et al. | 204/192.12 |
| 5,911,832 A | 6/1999 | Denholm et al. | 118/723 |
| 5,935,077 A | 8/1999 | Ogle | 600/504 |
| 5,944,942 A | 8/1999 | Ogle | 156/345 |
| 5,948,168 A | 9/1999 | Shan et al. | 118/723 |
| 5,958,140 A | 9/1999 | Arami et al. | 118/725 |
| 5,985,742 A | 11/1999 | Henley et al. | 438/515 |
| 5,994,207 A | 11/1999 | Henley et al. | 438/515 |
| 5,994,236 A | 11/1999 | Ogle | 48/728 |
| 5,998,933 A | 12/1999 | Shun'ko | 315/11.51 |
| 6,000,360 A | 12/1999 | Koshimuzu | 118/723 |
| 6,013,567 A | 1/2000 | Henley et al. | 438/515 |
| 6,020,592 A | 2/2000 | Liebert et al. | 250/492.21 |
| 6,029,602 A * | 2/2000 | Bhatnagar | 118/723 ME |
| 6,041,735 A | 3/2000 | Murzin et al. | 118/723 |
| 6,050,218 A | 4/2000 | Chen et al. | 118/723 |
| 6,055,927 A | 5/2000 | Shang et al. | 118/783 |
| 6,076,483 A * | 6/2000 | Shintani et al. | 118/723 MA |
| 6,081,414 A | 6/2000 | Flanigan et al. | 361/234 |
| 6,083,363 A * | 7/2000 | Ashtiani et al. | 204/298.01 |
| 6,096,661 A | 8/2000 | Ngo et al. | 438/788 |
| 6,101,971 A | 8/2000 | Denholm et al. | 118/723 |
| 6,103,599 A | 8/2000 | Henley et al. | 438/459 |
| 6,121,161 A | 9/2000 | Rossman et al. | 438/783 |
| 6,132,552 A | 10/2000 | Donohoe et al. | 156/345 |
| 6,139,697 A | 10/2000 | Chen et al. | 204/192.15 |
| 6,150,628 A | 11/2000 | Smith et al. | 219/121.54 |
| 6,153,524 A | 11/2000 | Henley et al. | 438/691 |
| 6,155,090 A | 12/2000 | Rubenson | 70/367 |
| 6,164,241 A | 12/2000 | Chen et al. | 118/723 |
| 6,165,376 A | 12/2000 | Miyake et al. | 216/67 |
| 6,174,450 B1 | 1/2001 | Patrick et al. | 216/61 |
| 6,174,743 B1 | 1/2001 | Pangrle et al. | 438/14 |
| 6,180,496 B1 | 1/2001 | Farrens et al. | 438/455 |
| 6,182,604 B1 | 2/2001 | Goeckner et al. | 118/723 |
| 6,187,110 B1 | 2/2001 | Henley et al. | 148/33.2 |
| 6,200,893 B1 * | 3/2001 | Sneh | 438/685 |
| 6,207,005 B1 | 3/2001 | Henley et al. | 156/345 |
| 6,237,527 B1 | 5/2001 | Kellerman et al. | 118/723 |
| 6,239,553 B1 | 5/2001 | Barnes et al. | 315/111.51 |
| 6,248,642 B1 | 6/2001 | Dolan et al. | 438/407 |
| 6,265,328 B1 | 7/2001 | Henley et al. | 438/782 |
| 6,291,313 B1 | 9/2001 | Henley et al. | 438/458 |
| 6,291,939 B1 | 9/2001 | Dolan et al. | 438/407 |
| 6,300,643 B1 | 10/2001 | Fang et al. | 250/492.21 |
| 6,303,519 B1 | 10/2001 | Hsiao et al. | 438/758 |
| 6,305,316 B1 | 10/2001 | DiVergilio et al. | 118/723 |
| 6,335,536 B1 | 1/2002 | Goeckner et al. | 250/492.3 |
| 6,339,297 B1 | 1/2002 | Sugai et al. | 315/111.21 |
| 6,341,574 B1 | 1/2002 | Bailey, III et al. | 118/723 |
| 6,348,126 B1 | 2/2002 | Hanwa et al. | 156/345 |
| 6,350,697 B1 | 2/2002 | Richardson et al. | 438/710 |
| 6,387,719 B1 | 5/2002 | Mrvos et al. | 438/21 |
| 6,392,351 B1 | 5/2002 | Shun'ko | 315/111.51 |
| 6,395,150 B1 | 5/2002 | Van Cleemput et al. | 204/192.37 |
| 6,403,453 B1 | 6/2002 | Ono et al. | 438/513 |
| 6,410,449 B1 * | 6/2002 | Hanawa et al. | 438/706 |
| 6,413,321 B1 | 7/2002 | Kim et al. | 118/725 |
| 6,417,078 B1 | 7/2002 | Dolan et al. | 438/480 |
| 6,418,874 B1 | 7/2002 | Cox et al. | 118/723 |
| 6,426,015 B1 | 7/2002 | Xia et al. | 216/62 |
| 6,432,260 B1 | 8/2002 | Mahoney et al. | 156/345.35 |
| 6,433,553 B1 | 8/2002 | Goeckner et al. | 324/464 |
| 6,453,842 B1 | 9/2002 | Hanawa et al. | 118/723 |
| 6,461,972 B1 | 10/2002 | Kabansky | 438/710 |
| 6,468,388 B1 | 10/2002 | Hanawa et al. | 156/345.48 |
| 6,492,612 B1 | 12/2002 | Taguchi et al. | 219/121.43 |
| 6,494,986 B1 | 12/2002 | Hanawa et al. | 156/345.35 |
| 6,511,899 B1 | 1/2003 | Henley et al. | 438/515 |
| 6,513,538 B2 | 2/2003 | Chung et al. | 134/1.2 |
| 6,514,838 B2 | 2/2003 | Chan | 438/513 |
| 6,528,391 B1 | 3/2003 | Henley et al. | 438/459 |
| 6,551,446 B1 | 4/2003 | Hanwa et al. | 156/345.48 |

| | | | |
|---|---|---|---|
| 6,559,408 B2 | 5/2003 | Smith et al. ............ 219/121.57 |
| 6,572,935 B1* | 6/2003 | He et al. .................... 427/577 |
| 6,579,805 B1 | 6/2003 | Bar-Gadda ................. 438/710 |
| 6,582,999 B2 | 6/2003 | Henley et al. .............. 438/221 |
| 6,593,173 B1 | 7/2003 | Anc et al. ................... 438/149 |
| 6,643,557 B1 | 11/2003 | Miller et al. ................ 700/110 |
| 6,645,828 B1 | 11/2003 | Farrens et al. .............. 438/455 |
| 6,679,981 B1 | 1/2004 | Pan et al. ............... 204/298.06 |
| 6,780,759 B2 | 8/2004 | Farrens et al. .............. 438/635 |
| 6,800,559 B2 | 10/2004 | Bar-Gadda ................. 438/710 |
| 6,811,448 B1 | 11/2004 | Paton et al. ................. 439/706 |
| 6,838,695 B2 | 1/2005 | Doris et al. .................. 257/55 |
| 6,893,907 B2* | 5/2005 | Maydan et al. ............. 438/149 |
| 7,037,813 B2* | 5/2006 | Collins et al. .............. 438/510 |
| 7,094,670 B2* | 8/2006 | Collins et al. .............. 438/513 |
| 7,109,098 B1* | 9/2006 | Ramaswamy et al. ....... 438/513 |
| 7,137,354 B2* | 11/2006 | Collins et al. .......... 118/723 IR |
| 7,166,524 B2* | 1/2007 | Al-Bayati et al. ........... 438/530 |
| 7,223,676 B2* | 5/2007 | Hanawa et al. ............. 438/515 |
| 7,288,491 B2* | 10/2007 | Collins et al. .............. 438/780 |
| 7,291,360 B2* | 11/2007 | Hanawa et al. ........... 427/248.1 |
| 7,294,563 B2* | 11/2007 | Al-Bayati et al. ........... 438/513 |
| 7,303,982 B2* | 12/2007 | Collins et al. .............. 438/514 |
| 7,312,162 B2* | 12/2007 | Ramaswamy et al. ....... 438/758 |
| 7,323,401 B2* | 1/2008 | Ramaswamy et al. ....... 438/551 |
| 7,381,291 B2* | 6/2008 | Tobe et al. .............. 156/345.43 |
| 7,393,765 B2* | 7/2008 | Hanawa et al. ............. 438/515 |
| 2001/0042827 A1 | 11/2001 | Fang et al. |
| 2002/0047543 A1 | 4/2002 | Sugai et al. ............ 315/111.21 |
| 2003/0013260 A1 | 1/2003 | Gossman et al. ............ 438/301 |
| 2003/0013314 A1 | 1/2003 | Ying et al. .................. 438/302 |
| 2003/0029567 A1 | 2/2003 | Dhindsa et al. ......... 156/345.47 |
| 2003/0052083 A1 | 3/2003 | Kim et al. .................... 216/59 |
| 2003/0085205 A1 | 5/2003 | Lai et al. ............... 219/121.43 |
| 2003/0211705 A1 | 11/2003 | Tong et al. .................. 438/455 |
| 2004/0036038 A1 | 2/2004 | Okumura et al. ......... 250/492.2 |
| 2004/0045813 A1 | 3/2004 | Kanno et al. ................ 204/242 |
| 2004/0092084 A1 | 5/2004 | Rayssac ...................... 438/455 |
| 2004/0126993 A1 | 7/2004 | Chan et al. .................. 438/455 |
| 2005/0191827 A1* | 9/2005 | Collins et al. .............. 438/513 |
| 2005/0230047 A1 | 10/2005 | Collins et al. .............. 118/100 |
| 2005/0255257 A1* | 11/2005 | Choi et al. .................. 427/585 |
| 2006/0002052 A1* | 1/2006 | Lagos ........................ 361/234 |
| 2007/0212811 A1* | 9/2007 | Hanawa et al. .............. 438/104 |

FOREIGN PATENT DOCUMENTS

| | | |
|---|---|---|
| EP | 0 836 218 A2 | 4/1998 |
| EP | 0 964 074 A2 | 12/1999 |
| EP | 1 054 433 A1 | 11/2000 |
| EP | 1 111 084 A1 | 6/2001 |
| EP | 1 158 071 A2 | 11/2001 |
| EP | 1 191 121 A1 | 3/2002 |
| JP | 59-86214 | 5/1984 |
| JP | 59-218728 | 12/1984 |
| JP | 62-120041 | 6/1987 |
| JP | 070455542 | 2/1995 |
| WO | WO 99/00832 | 1/1999 |
| WO | WO 01/11650 A1 | 2/2001 |
| WO | WO 02/25694 A2 | 3/2002 |
| WO | WO 93/18201 | 9/2003 |

OTHER PUBLICATIONS

Zhang, B.C., and Cross, R.C., "A high power radio frequency transformer for plasma production," *Rev. Sci. Instrum.*, vol. 69, No. 1, pp. 101-108, Jan. 1998.

U.S. Appl. No. 09/638,075, filed Aug. 11, 2000, entitled, "Externally Excited Torroidal Plasma Source," By Hanwa, et al., now PN 7,094,316, issued Aug. 22, 2006.

Wolf, Stanley and Taubner, Richard, "Silicon Processing for the VLSI Era", 2000, Lattice Press, vol. 1, pp. 303-308, no month.

Hu, C.-K., et al., "A process for improved Al(cu) reactive ion etching", *Journal of Vacuum Science and Technology*, May 1, 1989, pp. 682-685, vol. 7, No. 3, American Institute of Physics, New York, U.S.

JP 2000150908, May 20, 2000, Japan, Semiconductor Energy Lab Co. Ltd., no patent documents supplied, only English abstract.

Translation of JP 60-103099 A, Jun. 1985, Japan, Aida, Hiroshi, no actual patent documents supplied.

JP 04318168 A, Sep. 11, 1992, Japan, Kuwabara Hajime, English abstracts of Japanese patents.

JP 07130496 A, May 19, 1995, Japan, Kazumichi Suzuki, English abstracts of Japanese patents.

JP 09186337 A, Jul. 15, 1997, Japan, Nakahori Masaki, English abstracts of Japanese patents.

\* cited by examiner

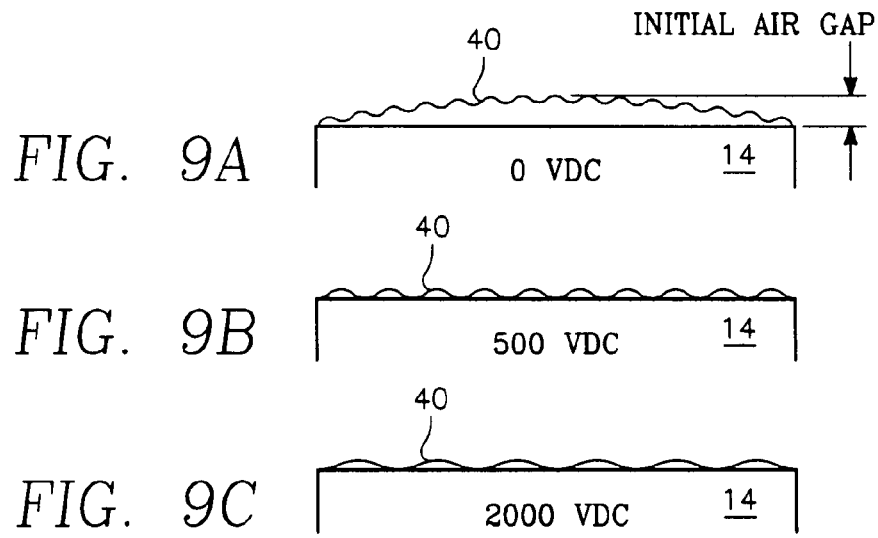
FIG. 9A
FIG. 9B
FIG. 9C
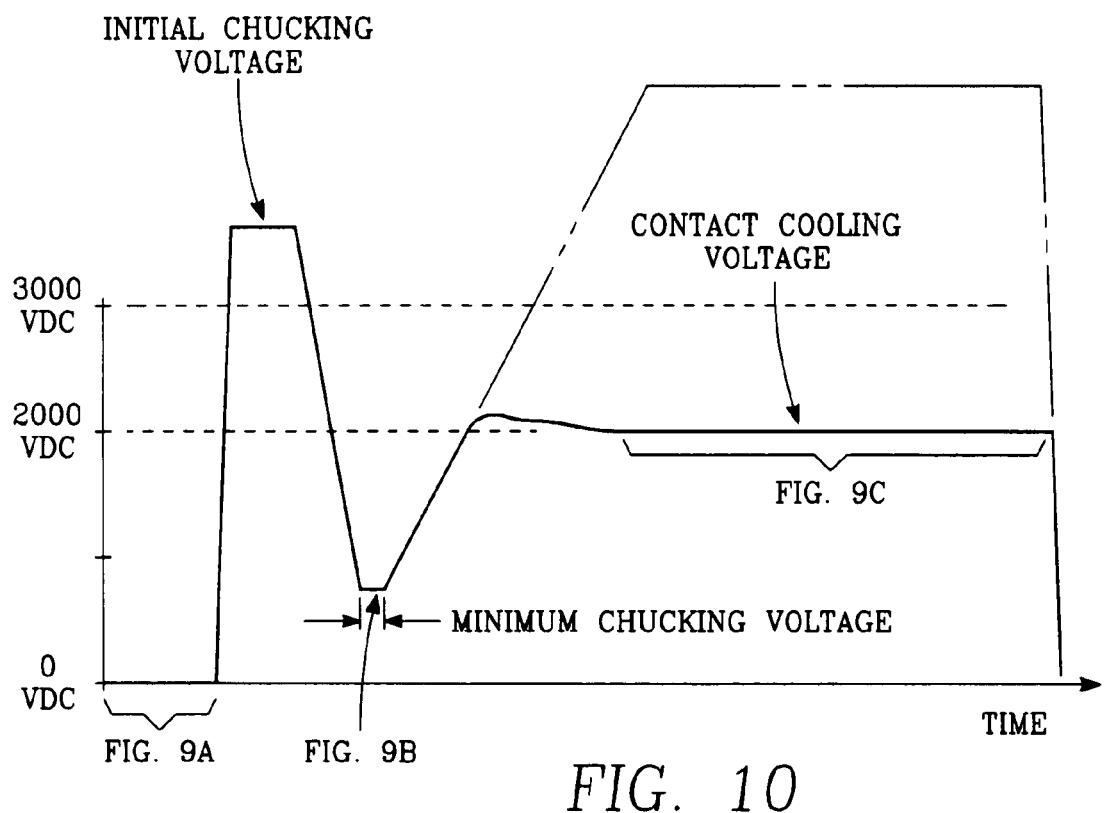
FIG. 10

PLASMA IMMERSION ION IMPLANTATION PROCESS

CROSS-REFERENCE TO RELATED APPLICATIONS

This application is a continuation-in-part of U.S. application Ser. No. 10/929,104, filed Aug. 26, 2004, now abandoned, entitled GASLESS HIGH VOLTAGE HIGH CONTACT FORCE WAFER CONTACT-COOLING ELECTROSTATIC CHUCK by Douglas A. Buchberger, Jr., et al. This application is also a continuation-in-part of U.S. application Ser. No. 10/838,052, filed May 3, 2004 entitled LOW TEMPERATURE CVD PROCESS WITH CONFORMALITY, STRESS AND COMPOSITION by Hiroji Hanawa, et al., now issued as U.S. Pat. No. 7,223,676, which is a continuation-in-part of U.S. application Ser. No. 10/786,410, filed Feb. 24, 2004 entitled FABRICATION OF SILICON-ON-INSULATOR STRUCTURE USING PLASMA IMMERSION ION IMPLANTATION by Dan Maydan, et al., now issued as U.S. Pat. No. 6,893,907, which is a continuation-in-part of U.S. application Ser. No. 10/646,533, filed Aug. 22, 2003 entitled PLASMA IMMERSION ION IMPLANTATION PROCESS USING A PLASMA SOURCE HAVING LOW DISSOCIATION AND LOW MINIMUM PLASMA VOLTAGE, which is a continuation-in-part of U.S. application Ser. No. 10/164,327, filed Jun. 5, 2002 entitled EXTERNALLY EXCITED TORROIDAL PLASMA SOURCE WITH MAGNETIC CONTROL OF ION DISTRIBUTION by Kenneth Collins et al., now issued as U.S. Pat. No. 6,939,434, which is a continuation-in-part of U.S. application Ser. No. 09/636,435, filed Aug. 11, 2000 entitled EXTERNALLY EXCITED MULTIPLE TORROIDAL PLASMA SOURCE by Hiroji Hanawa et al., now issued as U.S. Pat. No. 6,494,986 B1, all of which applications listed above are assigned to the present assignee.

BACKGROUND OF THE INVENTION

The present invention concerns plasma immersion ion implantation reactors of the type disclosed in the above-referenced parent applications in which a pair of external reentrant conduits define a pair of transverse toroidal paths in which RF oscillating plasma currents are maintained by RF source power applied to the interiors of the conduits. A plasma immersion ion implantation process carried out in such a reactor typically requires that the semiconductor wafer be cleaned or otherwise prepared beforehand. Such a cleaning process can be carried out very rapidly using a plasma process, but this can leave the wafer surface very rough, leading to inferior results. For example, a rough surface that is ion implanted with a dopant material can have an excessive sheet resistance. Deposition of an epitaxial layer (by a plasma enhanced chemical vapor deposition process, for example) on a rough surface can result in a low quality deposited layer that is less crystalline and more amorphous. Such problems can be avoided by carrying out the wafer cleaning process using a cleaning gas without employing any plasma. This approach leaves the smoothest wafer surface but can be unacceptably slow, and in many cases should be carried out at a sufficiently high temperature to activate the gas species. Such a high temperature can exceed the wafer process thermal budget. In order to clean the wafer faster but avoid surface damage of the type encountered with plasma cleaning processes and high temperatures of the non-plasma cleaning process, the cleaning gas can be dissociated into reactive neutrals. This latter approach would be ideal, except that it requires a remote plasma source (RPS) reactor that furnishes the reactive neutrals or radicals to the main chamber. The problem is that the external feed from the RPS chamber to the main chamber holding the wafer does not provide a uniform distribution of the neutrals or radicals over the wafer surface, so that the wafer cannot be cleaned uniformly. Typically, the radicals or neutrals from the RPS chamber are fed to a side port of the main chamber, leading to the non-uniformity. What is needed is a way of cleaning a wafer rapidly and uniformly without impairing wafer surface quality and without having to employ very high temperatures.

A plasma immersion ion implantation reactor must be cleaned periodically. In some cases, such periodic cleaning is required to avoid excessive metal contamination of the wafer process. The best results (lowest contamination) are obtained when the chamber is cleaned every time a wafer is processed. This is only practical if the cleaning process is less than the time required to perform the wafer process, in order to avoid an excess loss of productivity. The fastest processes for cleaning the chamber interior are plasma cleaning processes, and these can meet the productivity goals. Unfortunately, plasma cleaning process are so fast that they tend to consume a relatively large fraction of the chamber surfaces and elements (such as process kits), and therefore are extremely costly insofar as they require frequent replacement of chamber interior parts and materials. The minimum consumption of chamber interior elements for a thorough cleaning is obtained using cleaning gases without a plasma, but this approach is too time-consuming. The best compromise is obtained by employing dissociated cleaning gases. The problem with this approach is that distribution within the main chamber of the dissociated cleaning gases from an external remote plasma source (RPS) chamber is non-uniform, so that the main chamber cannot be cleaned uniformly. This is because the external feed from the RPS chamber to the main chamber does not provide a uniform distribution of the neutrals or radicals within the main chamber. Typically, the dissociated gases from the RPS chamber are fed to a side port of the main chamber.

One problem encountered in plasma immersion ion implantation is that the dopant-containing process gas can sometimes form a film on the surface being implanted that can block the implantation or distort the implant depth profile from the desired one. Such an unwanted film can, in some cases, distort the ion implantation depth profile (or render it difficult to control during implantation), so that the resulting depth profile may not be ideal. Another problem is that the ion bombardment can etch away the surface being implanted, removing much of the implanted ions and thereby attenuating the desired effects of the implantation process. In a dopant implantation process in a semiconductor layer, this problem manifests itself as a high sheet resistance.

Another problem that can arise in any plasma process is contamination on the wafer backside that degrades subsequent wafer processing steps. Our experience has led us to believe that such backside contamination arises from contact between the wafer backside and the electrostatic chuck (ESC) top surface and the flexing of the wafer during wafer chucking and dechucking. Metallic contamination occurs because in many cases the insulating layer on the ESC surface is a metal containing compound such as AlN. AlN particles scraped onto the wafer backside from the ESC can be dissociated in later plasma process steps to free the Al species and form metallic contamination, which can degrade process performance. There is a need to prevent such contamination without creating other burdens on the process.

SUMMARY OF THE INVENTION

One method of performing plasma immersion ion implantation on a workpiece in a plasma reactor chamber includes initially depositing a seasoning film on the interior surfaces of the plasma reactor chamber before the workpiece is introduced, by introducing a seasoning film precursor gas into the chamber and generating a plasma within the chamber, performing plasma immersion ion implantation on the workpiece by introducing an implant species precursor gas into the chamber and generating a plasma, and then removing the workpiece from the chamber and removing the seasoning film from the chamber interior surfaces. In one embodiment, the implant species precursor gas comprises a fluoride of a dopant species, the seasoning film precursor gas comprises a fluorocarbon gas and the seasoning film comprises a fluorocarbon polymer. In another embodiment, the implant species precursor gas comprises a hydride of a dopant species, the seasoning film precursor gas comprises a hydrocarbon gas and the seasoning film comprises a fluorocarbon polymer. In a further embodiment, the implant species precursor gas comprises nitrogen gas, the seasoning film precursor gas comprises nitrogen and a hydride of silicon and the seasoning film comprises silicon nitride. In yet another embodiment, the implant precursor species comprises fluorine, the seasoning film precursor gas comprises a fluorocarbon gas and the seasoning film comprises a fluorocarbon polymer.

A method of processing a workpiece in a plasma reactor chamber includes initially depositing an elastic cushioning film on the wafer-support surface of a wafer support within the chamber before introduction of the workpiece, by introducing an elastic material precursor gas into the chamber and generating a plasma within the chamber, placing the workpiece on the elastic cushioning film a workpiece support in the chamber, and introducing a workpiece processing gas into the chamber and processing the workpiece in the chamber. This is followed by removing the workpiece from the chamber and removing the elastic cushioning film from the wafer support. The elastic material precursor gas can be one of (a) a fluorocarbon gas, (b) a hydrocarbon gas, (c) a fluoro-hydrocarbon gas, and wherein the elastic cushioning layer comprises a polymer. Preferably, the method includes providing a generally uninterrupted continuous polished surface as the workpiece support surface of the wafer support. In this case, the temperature of the workpiece can be controlled by applying a sufficiently large electrostatic workpiece-clamping voltage to attain a desired workpiece temperature.

In another aspect, a multimode plasma reactor includes a main chamber having an enclosure comprising a side wall and a ceiling, the ceiling comprising a gas distribution showerhead, a wafer support in the main chamber facing the ceiling, a pair of openings through the enclosure on generally opposite sides of the chamber, a first hollow reentrant conduit having two ends coupled to the pair of openings and defining a first closed reentrant path through the first conduit and across a process region between the wafer support and the showerhead, the toroidal path surrounding the ceiling, a first plasma source power applicator facing a section of the first reentrant conduit. The reactor further includes a remote plasma source chamber having a process gas input, a radical supply conduit coupled between the remote plasma source chamber and the gas distribution showerhead of the main chamber, a first gas supply feed line coupled to the remote plasma source chamber, a second gas supply feed line coupled to the gas distribution showerhead of the main chamber, and a gas supply coupled to at least one of the gas supply feed lines. The main chamber can further include main chamber gas injectors, the reactor further including a third gas supply feed line coupled to the gas injectors.

The wafer support can be a high contact force electrostatic chuck having a flat polished workpiece contact surface, in which case a workpiece temperature controller governs a wafer clamping voltage of the electrostatic chuck. The bias source can be one of (a) an RF source, (b) a D.C. source. The plasma source power applicator can include a toroidal core of a magnetic material surrounding a section of the reentrant conduit and a conductor wound around the core and coupled to the RF source power generator.

A method of processing a workpiece in a plasma reactor chamber having a gas distribution showerhead facing a workpiece support and defining a process region therebetween, includes initially depositing a seasoning film on interior surfaces of the chamber by introducing a seasoning film precursor gas into the reactor chamber and generating an oscillating plasma current in a toroidal path that passes through the process region and through an external reentrant hollow conduit. The method further proceeds with the steps of introducing the workpiece into the reactor chamber and processing it by introducing a workpiece process precursor gas into a remote plasma source chamber, generating a plasma in the remote plasma source chamber, and delivering radicals from the plasma in the remote plasma source chamber to the gas distribution showerhead of the plasma reactor chamber whereby to distribute the radicals in the process region over the workpiece. These steps are preferably followed by removing the workpiece from the reactor chamber and then removing the seasoning film from the chamber interior surfaces by introducing a seasoning film etchant precursor gas into the remote plasma source chamber, generating a plasma in the remote source plasma chamber, and delivering radicals from the plasma in the remote source plasma chamber to the gas distribution showerhead of the plasma reactor chamber whereby to distribute the radicals in the plasma reactor chamber.

A method of processing a workpiece in a plasma reactor chamber having a gas distribution showerhead facing a workpiece support and defining a process region therebetween, includes initially depositing a seasoning film on interior surfaces of the chamber by introducing a seasoning film precursor gas into the reactor chamber and generating an oscillating plasma current in a toroidal path that passes through the process region and through an external reentrant hollow conduit. The method further proceeds with the steps of introducing the workpiece into the reactor chamber and processing it by introducing a non-reactive gas into a remote plasma source chamber, generating a plasma in the remote plasma source chamber, delivering excited non-reactive gas from the plasma in the remote plasma source chamber to the gas distribution showerhead of the plasma reactor chamber whereby to distribute the excited non-reactive gas in the process region over the workpiece, and introducing into the plasma reactor chamber a workpiece process gas comprising reactive species. Preferably, the plasma in the remote plasma source chamber comprises excited gas having sufficient energy to dissociate at least a portion of the workpiece process gas in the plasma reactor chamber. These steps are preferably followed by removing the workpiece from the reactor chamber and then removing the seasoning film from the chamber interior surfaces by introducing a seasoning film etchant precursor gas into the remote plasma source chamber, generating a plasma in the remote source plasma chamber, and delivering radicals from the plasma in the remote source plasma chamber to the gas distribution showerhead of the plasma reactor chamber whereby to distribute the radicals in the plasma reactor chamber.

A method of processing a workpiece in a plasma reactor chamber having a gas distribution showerhead facing a workpiece support and defining a process region therebetween, and having a reentrant hollow conduit providing a toroidal path extending across the process region and through the reentrant hollow conduit, includes introducing a workpiece process reactive gas into a remote plasma source chamber, generating a plasma in the remote plasma source chamber, delivering reactive radicals from the plasma in the remote plasma source chamber to the gas distribution showerhead of the plasma reactor chamber whereby to distribute the radicals in the process region over the workpiece, and generating an oscillating plasma current in the toroidal path. The oscillating plasma current can be generated by applying RF plasma source power to an interior portion of the conduit. The method can further include coupling a bias source to the workpiece support.

BRIEF DESCRIPTION OF THE DRAWINGS

FIGS. 9A, 9B and 9C illustrate the wafer curvature for different magnitudes of the chucking voltage.

FIG. 10 illustrates the chucking voltage over time corresponding to the sequence of FIGS. 9A through 9C.

DETAILED DESCRIPTION OF THE INVENTION

Figure 1:
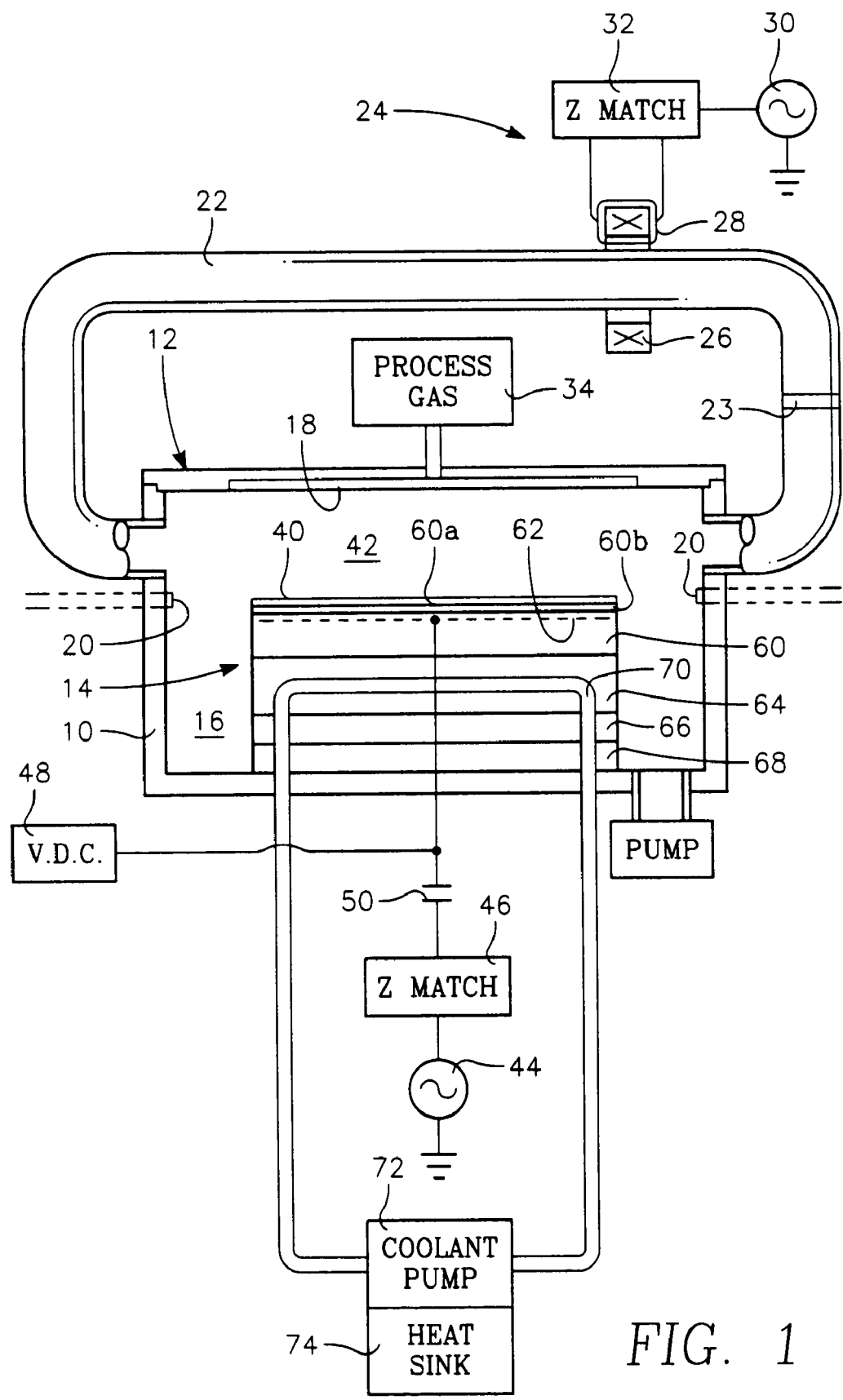
FIG. 1 is a cut-away side view of a plasma reactor for processing a semiconductor wafer that includes the wafer contact-cooling electrostatic chuck.
Figure 2:
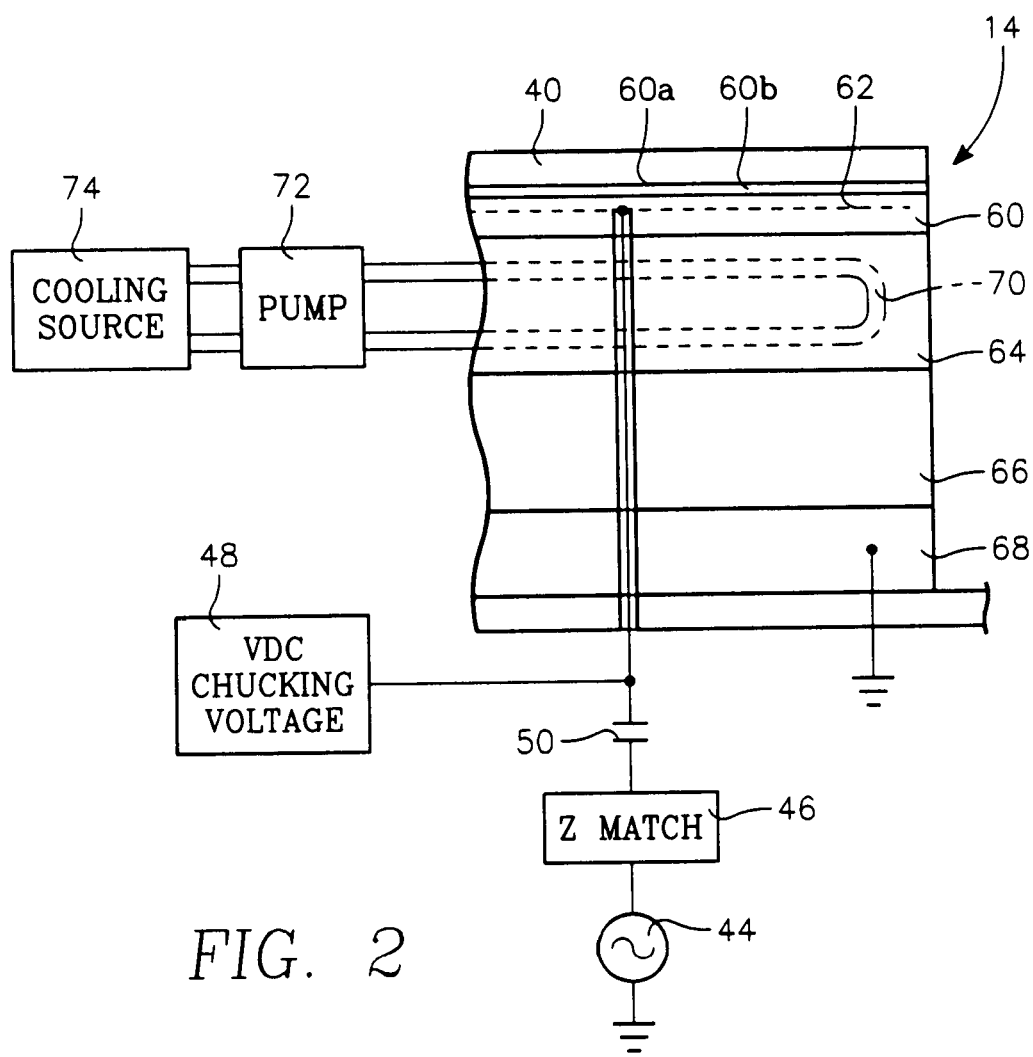
FIG. 2 is a cross-sectional side view of the wafer contact-cooling electrostatic chuck.
Figure 3:
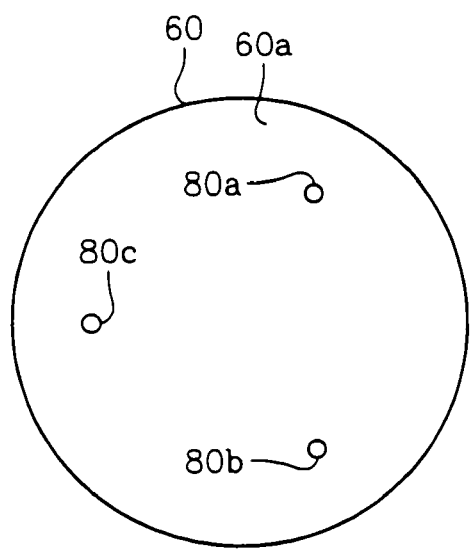
FIGS. 3 and 4 are top cross-sectional views of different layers of the wafer contact-cooling electrostatic chuck.
Figure 4:
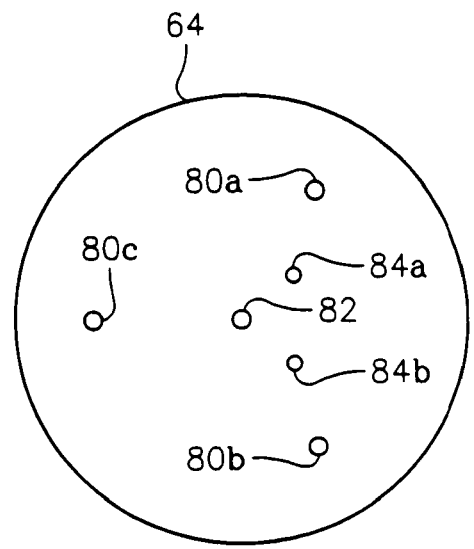

High Contact Force Gasless Electrostatic Chuck:

FIGS. 1 through 4 depict a plasma reactor with the wafer contact-cooling electrostatic chuck in accordance with certain embodiments of the invention. FIG. 1 is a cut-away side view of a plasma reactor for processing a semiconductor reactor that includes the wafer contact-cooling electrostatic chuck. FIG. 2 is a cross-sectional side view of the wafer contact-cooling electrostatic chuck. FIGS. 3 and 4 are top cross-sectional views of different layers of the wafer contact-cooling electrostatic chuck. In FIG. 1, the plasma reactor has a cylindrical side wall 10, a ceiling 12 and a wafer contact-cooling electrostatic chuck 14. A pumping annulus 16 is defined between the chuck 14 and the sidewall 10. While the wafer contact-cooling electrostatic chuck 14 may be used in any type of plasma reactor or other reactor (such as thermal process reactor), the reactor in the example of FIG. 1 is of the type in which process gases can be introduced through a gas distribution plate 18 (or "showerhead") forming a large portion of the ceiling 12. Alternatively, the reactor could have gas distribution inlets 20 (dashed lines) that are separate from the ceiling 12. While the wafer contact-cooling electrostatic chuck 14 may be employed in conjunction with any plasma source (such as an inductively coupled RF plasma source, a capacitively coupled RF plasma source or a microwave plasma source), the reactor in the example of FIG. 1 has a reentrant RF torroidal plasma source consisting of an external reentrant tube 22 coupled to the interior of the reactor through opposite sides of the sidewall 10 (or, through openings in the ceiling 12 not shown in FIG. 1). An insulating ring 23 provides a D.C. break along the reentrant tube 22. The torroidal plasma source further includes an RF power applicator 24 that may include a magnetically permeable torroidal core 26 surrounding an annular portion of the reentrant tube 22, a conductive coil 28 wound around a portion of the core 26 and an RF plasma source power generator 30 coupled to the conductive coil through an optional impedance match circuit 32. A process gas supply 34 is coupled to the gas distribution plate 18 (or to the gas injectors 20). A semiconductor wafer or workpiece 40 is placed on top of the chuck 14. A processing region 42 is defined between the wafer 40 and the ceiling 12 (including the gas distribution plate 18). A torroidal plasma current oscillates at the frequency of the RF plasma source power generator 30 along a closed torroidal path extending through the reentrant tube 22 and the processing region 42.

RF bias power is applied to the chuck 14 by an RF bias power generator 44 through an impedance match circuit 46. A D.C. chucking voltage is applied to the chuck 14 from a chucking voltage source 48 isolated from the RF bias power generator 44 by an isolation capacitor 50. The RF power delivered to the wafer 40 from the RF bias power generator 44 can heat the wafer 40 to temperatures beyond 400 degrees C., depending upon the level and duration of the applied RF plasma bias power from the generator 44. It is believed that about 80% or more of the RF power from the bias power generator 44 is dissipated as heat in the wafer 40.

In other implementations, there may be little or no bias delivered by the bias power generator 44 (or there may be no bias power generator), in which case the wafer 40 is heated (indirectly) by power from the source power generator 30 via interaction between the wafer 40 and the plasma in the chamber. This interaction can include bombardment of the wafer by plasma ions, electrons and neutrals, with wafer heating arising from the kinetic energy of the ions, electrons and neutrals, as well as electrical effects arising from the interaction of the charged particles with electric fields in the vicinity of the wafer, as is well-known in the art. The wafer may be heated by radiation emitted by plasma species, such as ultraviolet, visible or infrared radiation emitted by excited atomic or molecular species (ions or neutrals) during relaxation, as is well known in the art. The wafer may be heated by other means, such as by hot surfaces in or adjacent the process chamber, by thermal radiation, convection or conduction, as is well known in the art. Thus, the wafer 40 is heated directly by RF power from the bias power generator 44 or indirectly (via wafer-plasma interaction) by RF power from the source power generator 30.

Conventionally, the wafer temperature was regulated to avoid overheating by providing coolant gas at a selected pressure between the wafer 40 and the chuck 14 and removing heat from the gas. Such gas introduction requires open gas channels in the chuck surface on which the wafer is mounted. The presence of such open coolant gas channels in the chuck surface creates two problems. First, the RF bias power applied to the chuck can cause the gas to break down in the channels. This problem is solved by either limiting the coolant gas pressure (which reduces the heat transfer from the wafer) or by limiting the RF bias voltage, e.g., to below 1 kV (which can negatively impact plasma processing). A second problem is that the many sharp edges defining the open gas channels in the chuck surface lead to contamination, either by the breaking off of material forming the sharp edges or by arcing near those edges, or by scratching of the wafer backside. A related problem is that in applications requiring very high RF bias power levels, the coolant gas breaks down (preventing operation) and the coolant gas system may have an insufficient heat transfer coefficient for the high heat load on the wafer.

The electrostatic chuck 14 of FIG. 2 is a wafer contact-cooling electrostatic chuck in which the portion of the chuck contacting the wafer is cooled. The wafer contact-cooling electrostatic chuck 14 requires no gas cooling source nor internal gas coolant passages to keep the wafer cool and remove heat from the wafer. Instead, the heat is removed from the wafer at a rate which limits the maximum wafer temperature or the time rate of rise of the wafer temperature during plasma processing, by cooling the chuck 14 itself while maintaining direct high-force contact between the wafer 40 and the chuck 14, as will now be described. Alternatively, the chucking voltage may be varied during wafer processing to vary the selected heat transfer coefficient in order to control wafer temperature to a target value. This latter feature may be carried out by monitoring the wafer temperature and varying the chuck voltage so as to minimize the difference between the measured wafer temperature and a target temperature. As the measured wafer temperature rises above a maximum target temperature, the chucking voltage is increased, and as the measured wafer temperature falls below a target minimum temperature, the chucking voltage may be decreased. Moreover, the high-force contact cooling of the wafer is able to control wafer temperature even at very high RF bias power levels.

Referring to FIG. 2, the chuck 14 has a top layer 60, referred to as a puck, consisting of insulative or semi-insulative material, such as aluminum nitride or aluminum oxide, which may be doped with other materials to control its electrical and thermal properties. A metal (molybdenum, for example) wire mesh or metal layer 62 inside of the puck 60 forms a cathode (or electrode) to which the chucking voltage is applied. The puck 60 may be formed as a ceramic. Or, it may be formed by plasma or physical deposition processes, or chemical vapor deposition process or plasma or flame spray coating or other method. It is supported on a metal layer 64, preferably consisting of a metal having a high thermal conductivity, such as aluminum. The metal layer 64 rests on a highly insulative layer 66 whose thickness, dielectric constant and dielectric loss tangent are chosen to provide the chuck 14 with selected RF characteristics (e.g., capacitance, loss resistance) compatible with the reactor design and process requirements. A metal base layer 68 is connected to ground. The wafer 40 is held on the chuck 14 by applying a D.C. voltage from the chucking voltage source 48 to the electrode 62. The application of voltage across the insulator layer 60 polarizes the insulator 60 and induces an opposite (attractive) image charge in the bottom surface of the wafer 40. In the case of a semi-insulator layer 60, in addition to inducing image charge in the bottom surface of the wafer, charge from the electrode 62 migrates through the semi-insulator layer 60 to accumulate very close to the top surface of the semi-insulator layer 60, for a minimum gap between the charge and the overlying wafer 40. (The term "semi-insulator" is discussed below.) This induces an opposite (attractive) image charge in the bottom surface of the wafer 40. The effective gap between the two opposing charge layers is so minimal as a result of the upward charge migration in the insulator layer 60 that the attractive force between the chuck and the wafer 40 is very large for a relatively small applied chucking voltage. For example, a chucking voltage of only 300 volts D.C. on the electrode 62 produces a chucking force across the wafer 40 equivalent to a pressure of about 100 Torr. The puck semi-insulator layer 60 therefore is formed of a material having a desired charge mobility, so that the material is not a perfect insulator (hence, the term "semi-insulator"). This semi-insulator material, although not a perfect insulator, may also not be a typical semiconductor, in some cases. In any case, the charge induced by the chucking voltage on the electrode 62 is mobile in the semi-insulator material of the puck layer 60, and therefore it may be said that the puck semi-insulator layer 60 is formed of a "charge mobile" material. One example of a material suitable for the puck semi-insulator or charge mobile layer 60 is aluminum nitride. Another example is aluminum oxide, which may optionally be doped to increase charge mobility. For example, the dopant material may be titanium dioxide.

RF bias power from the RF bias power generator 44 may be applied to the electrode 62 or, alternatively, to the metal layer 64 for RF coupling through the semi-insulative puck layer 60.

A very high heat transfer coefficient between the wafer 40 and the puck 60 is realized by maintaining a very high chucking force. A suitable range for this force depends upon the anticipated heat loading of the wafer, and will be discussed later in this specification. The heat transfer coefficient (having units of Watts/m$^{2\circ}$ K or heat flux density for a given temperature difference) of the wafer-to-puck contacting surfaces is adequate to remove heat at the rate heat is deposited on the wafer. Specifically, the heat transfer coefficient is adequate because during plasma processing it either limits the wafer temperature below a specified maximum temperature or limits the time rate of rise of the wafer temperature below a maximum rate of rise. The maximum wafer temperature may be selected to be anywhere in a practical range from on the order to 100 degrees C. or higher, depending upon the heat load. The maximum rate of heat rise during processing may be anywhere in a range from 3 to 20 degrees per second. Specific examples may be 20 degrees per second, or 10 degrees per second or 3 degrees per second. By comparison, if the wafer is uncooled, the rate of heat rise may be 86.7 degrees per second in the case of a typical 300 mm silicon wafer with a heat load of 7500 Watts, 80% of which is absorbed by the wafer. Thus, the rate of temperature rise is reduced to one-fourth of the uncooled rate of heat rise in one embodiment of the invention.

Such performance is accomplished, first, by maintaining the puck at a sufficiently low temperature (for example, about 80° C. below the target wafer temperature), and second, by providing the top surface of the puck 60 with a sufficiently smooth finish (e.g., on the order of ten's of micro-inches RMS deviation, or preferably on the order of micro-inches RMS deviation). For this purpose, the top surface 60*a* of the puck 60 can be highly polished to a finish on the order of about 2 micro-inches RMS deviation, for example. Furthermore, heat is removed from the puck 60 by cooling the metal layer 64. For this reason, internal coolant passages 70 are provided within the metal layer 64 coupled to a coolant pump 72 and heat sink or cooling source 74. In an alternative embodiment, the internal cooling passages 70 may extend into the puck 60 or adjacent its back surface in addition or instead of extending through the metal layer 64. In any case, the coolant passages 70 are thermally coupled to the puck 60, either directly or through the metal layer 64, and are for cooling the puck 60. The coolant liquid circulating through the internal passages 70 can be water, ethylene glycol or a mixture, for example. Alternatively, the coolant may be a perfluorinated heat transfer liquid such as "fluorinert" (made by 3M company). Unlike the internal gas coolant passages of conventional chucks, this feature presents little or no risk of arcing in the presence of high RF bias power applied to the chuck 14 by the RF bias power generator 44.

The chucking voltage required to attain a particular heat transfer coefficient is increased if an insulating (oxide or nitride, for example) layer is added to the wafer backside. Therefore, the chucking voltage must be determined empirically each time a new batch of wafers is to be processed. This is inconvenient and reduces productivity. One way around this problem is to mask the difference between wafers with and without a backside oxide layer. The difference is masked by adding a thin insulating layer 60*b* on the top puck surface 60*a*. The presence of such a thin insulating layer increases the requisite chucking voltage to reach a particular heat transfer coefficient value. In this way, the chucking voltage required remains at least nearly the same whether or not the wafer backside has an insulating layer. The thin insulating layer 60*b* may be formed on the top puck surface 60*a* during initial puck fabrication or may be formed within the process chamber.

One advantage of such contact-cooling of the wafer over the conventional method employing a coolant gas is that the thermal transfer efficiency between the coolant gas and each of the two surfaces (i.e., the puck surface and the wafer bottom surface) is very limited, in accordance with the thermal accommodation coefficient of the gas with the materials of the two surfaces. The heat transfer rate is attenuated by the product of the gas-to-wafer thermal accommodation coefficient and the gas-to-puck thermal accommodation coefficient. If both coefficients are about 0.5 (as a high rough estimate), then the wafer-gas-puck thermal conductance is attenuated by a factor of about 0.25. In contrast, the contact-cooling thermal conductance in the present invention has virtually no such attenuation, the thermal accommodation coefficient being in effect unity for the chuck 14 of FIGS. 1-4. Therefore, the contact cooling electrostatic chuck 14 can outperform conventional electrostatic chucks (i.e., electrostatic chucks that that employ gas cooling) by a factor of about four (or more) with sufficiently high attractive electrostatic force between wafer and puck. We have observed in preliminary tests an improvement of about a factor of three.

The heat transfer coefficient between the wafer 40 and the puck 60 in the wafer contact-cooling electrostatic chuck 14 is affected by the puck top surface finish and the chucking force. These parameters can be adjusted to achieve the requisite heat transfer coefficient for a particular environment. An important environmental factor determining the required heat transfer coefficient is the applied RF bias power level. It is believed that at least 80% of the RF bias power from the bias generator 44 is dissipated as heat in the wafer 40. Therefore, for example, if the RF bias power level is 7500 Watts and 80% of the RF bias power from the bias generator 44 is dissipated as heat in the wafer 40, if the wafer area is 706 cm$^2$ (300 mm diameter wafer) and if a 80 degrees C. temperature difference is allowed between the wafer 40 and the puck 60, then the required heat transfer coefficient is h=7500×80% Watts/(706 cm$^2$×80 degrees K), which is 1071 Watts/m$^{2\circ}$ K. For greater RF bias power levels, the heat transfer coefficient can be increased by augmenting any one or both of the foregoing factors, namely the temperature drop across the puck, the chucking force or the smoothness of the puck surface. Such a high heat transfer coefficient, rarely attained in conventional electrostatic chucks, is readily attained in the electrostatic chuck 14 of FIG. 2 by applying a sufficiently high chucking voltage, on the order of 1 kV, for example.

In addition, the heat transfer is improved by providing more puck surface area available for direct contact with the wafer backside. In a conventional chuck, the puck surface available for wafer contact is greatly reduced by the presence of open coolant gas channels machined, ground or otherwise formed in the puck surface. These channels occupy a large percentage of the puck surface. In the puck 60 of FIG. 3, the only interruptions in the surface are three small lift pin holes 80*a*, 80*b*, 80*c*. Therefore, the percentage of the puck cross-sectional area (3.14 r$^2$) based upon the puck radius (r) that is available for direct wafer contact is significantly higher (i.e., 30%-95% of the total cross-sectional area of the chuck), thus maximizing the wafer-puck heat transfer coefficient. A related feature is that the surface contact area between the puck 60 and the cooled metal plate 64 is likewise a very high percentage of the total cross-sectional area of the plate 64. This is because, as shown in FIG. 4, the plate 64 has a top surface interrupted by corresponding lift pin holes 80*a*, 80*b*, 80*c* and center electrical conduit hole 82. Its bottom surface has, in addition, coolant ingress and egress holes 84*a*, 84*b*.

Figure 5:
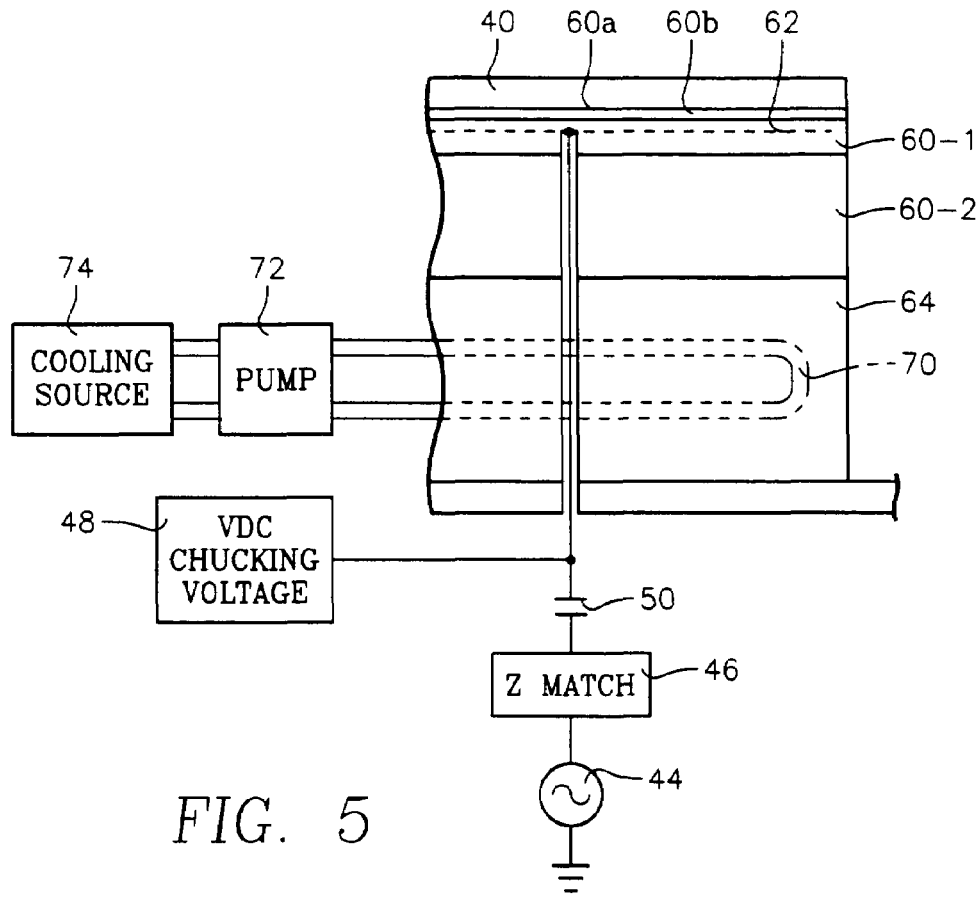
FIG. 5 illustrates an alternative implementation of the chuck of FIG. 2.

FIG. 5 illustrates an alternative implementation of the wafer contact-cooling electrostatic chuck of FIG. 2, in which the insulator layer 66 and the bottom metal layer 68 can be eliminated, while the puck 60 is modified to have two layers, an upper semi-insulative layer 60-1 (e.g., lower resistivity aluminum nitride) and a lower highly insulative (e.g., higher resistivity aluminum nitride) layer 60-2. In this implementation, the overall thickness of the puck 60 is greater, because the lower insulator layer 60-2 must be sufficiently thick to provide a certain RF capacitance selected by the system designer (requirement is typically to be less than some maximum value). The top puck layer 60-1 of FIG. 5 may be nearly identical to the puck 60 of FIG. 2.

Figure 6:
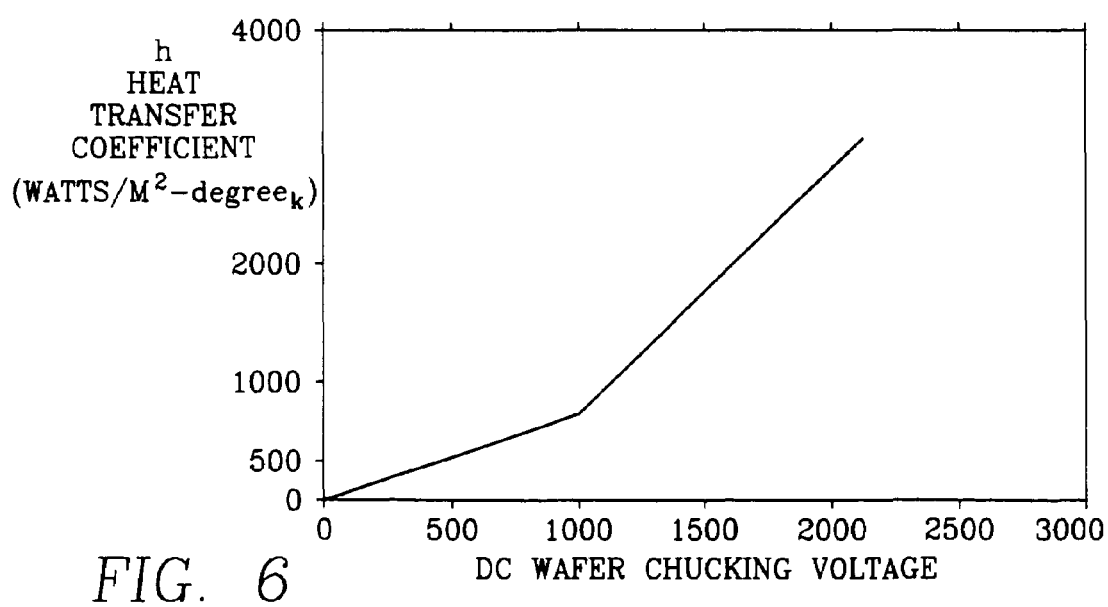
FIG. 6 illustrates the behavior of the heat transfer coefficient in the embodiment of FIG. 2 or 5 as a function of chucking voltage.

FIG. 6 is a graph illustrating the behavior of the heat transfer coefficient, h (vertical axis), as a function of the chucking voltage applied by the chucking voltage source 48 (horizontal axis). FIG. 6 shows that remarkably high heat transfer coefficient values (1000 to 3000 Watts/m$^{2\circ}$ K are obtained within a relatively modest range of chucking voltages (1000 to 2000 Volts D.C.).

Figure 7:
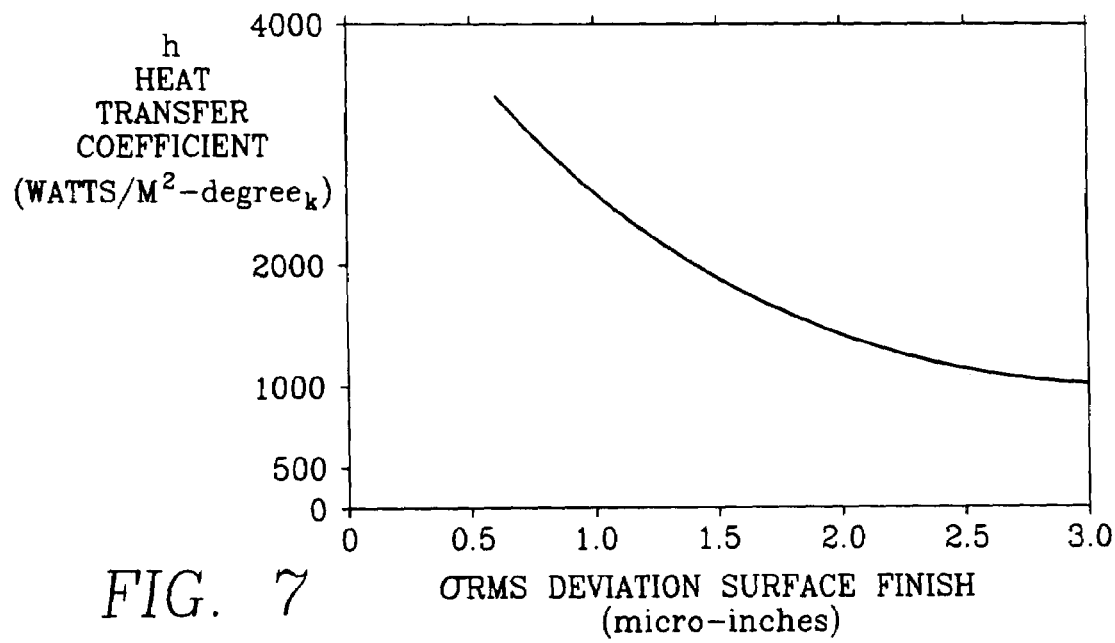
FIG. 7 illustrates the behavior of the heat transfer coefficient in the embodiment of FIG. 2 or 5 as a function of puck surface finish.

FIG. 7 is a graph illustrating the behavior of the heat transfer coefficient, h (vertical axis), as a function of the surface finish of the puck top surface 60*a*. FIG. 7 shows that robust heat transfer coefficient values (1000 to 3000 Watts/m²° K) are obtained within a practical range of surface finish values (1 to 3 micro-inches RMS).

Figure 8:
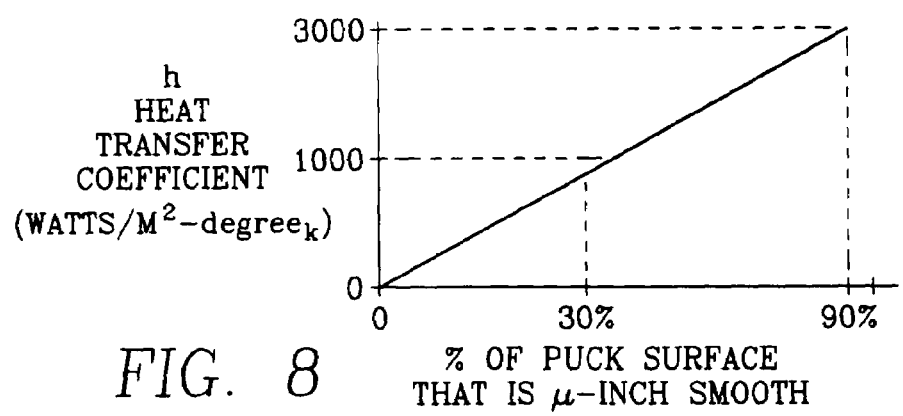
FIG. 8 illustrates the behavior of the heat transfer coefficient in the embodiment of FIG. 2 or 5 as a function of the proportion of the puck surface that is smooth.

FIG. 8 is a graph illustrating the behavior of the heat transfer coefficient, h (vertical axis), as a function of the percentage of the puck top surface 60a that is flat (e.g., not taken up by surface channels or holes). FIG. 8 shows that robust heat transfer coefficient values (1000 to 3000 Watts/m²° K) are obtained within a practical range of 30% to about 90%.

FIGS. 9A, 9B and 9C depict the wafer as it is first placed on the chuck 14 (of FIG. 2) prior to application of any chucking voltage (FIG. 9A), when the wafer is chucked to the puck with a minimal force (FIG. 9B), and when a very high chucking force is applied to realize a high heat transfer coefficient (FIG. 9C). Initially, the wafer has an equilibrium shape that includes a diameter-long bow (creating an initial puck-to-wafer air or vacuum gap) and many small ripples (FIG. 9A). In order to couple across the relatively large air gap of FIG. 9A, a very large chucking D.C. voltage must be applied to pull the wafer down to the puck, which removes the bow shape. This reduces the air gap, so that the wafer may now be held onto the chuck as in FIG. 9B with a much lower chucking voltage, since the effective gap is now miniscule (on the order of 5-10 microns or less). In FIG. 9B, the large bow in the wafer is eliminated, but the many ripples in the wafer shape persist. In order to ensure a large heat transfer coefficient sufficient to maintain wafer temperature at high RF bias power levels (e.g., 5-10 kWatts), a large chucking voltage must be applied, in the range of 1-4 kVolts. The large increase in chucking voltage deforms the wafer shape so that the ripples are at least partially flattened, but still can persist to a limited degree, as depicted in FIG. 9C. The greater chucking or contact force in FIG. 9C decreases the effective gap to as little as 1 micron or less, realizing a concomitant increase in wafer-puck heat transfer coefficient. FIG. 10 illustrates the chucking voltage as a function of time, corresponding to the sequence of FIGS. 9A through 9C. In FIG. 10, the high contact force chucking voltage is depicted as being less than the initial chucking voltage required to overcome the air gap when the wafer is first placed on the chuck. However, the high contact force chucking voltage may, instead, exceed the initial chucking voltage, as indicated in dashed line in FIG. 10. The application of an initially higher chucking voltage than the later applied chucking voltage may also improve the transient chucking force of the electrostatic chuck by driving the mobile charge more quickly to near the surface of the electrostatic chuck than otherwise possible with lower chucking voltage.

For higher wafer temperatures, the ESC may include one or more resistive heaters, either embedded within the ESC or as a separate heater thermally coupled to the ESC. The heated ESC may still include cooling channels for a thermally conductive fluid. Alternatively, the ESC or heater may be thermally coupled to a heat sink. Heater power and/or cooling may be controlled by a temperature feedback control system. For example, a ceramic aluminum nitride (AlN) electrostatic chuck (ESC) 14 includes the isolated electrode 62 embedded below the top surface (approximately 0.5-3 mm), and an isolated heater 75a embedded several mm below the isolated electrode. The ESC electrode connection and heater connections may be brought out separately through the backside of the ESC. The heat sink 74 may be thermally coupled to the ESC backside. As alternatives to the arrangement illustrated in FIG. 1, the heat sink 74 may be bonded to the ESC 14, or alternatively, the heat sink 74 may be thermally coupled to the ESC 14 via a vacuum interface across a small gap (i.e. 1 to hundreds of microns). The gas pressure in the gap may be varied to control the thermal coupling between the ESC and heat sink, or the gap may be varied. Alternatively, heat transfer fluid flow to the heat sink 74 may be switched on/off or varied continuously to control the thermal coupling between the ESC 14 and the heat sink 74. Such a system may allow operating with high, controlled wafer temperature, even as plasma source power and bias power are switched on/off or are varied.

For example, a wafer is to be plasma immersion ion implanted with boron, phosphorous or arsenic, using a hydride or fluoride dopant gas at a wafer temperature of 100-1000 degrees C. (preferably degrees 600 C), using 50 W-2 KW (preferably 500 W) plasma source power in each of two toroidal source conduits 22a, 22b (FIG. 11A) at an RF voltage of 0.3 kV-10 kVpp (preferably 5 kVpp) and a pressure of 5-100 mtorr (preferably 20 mtorr). The high wafer temperature may be desired, for example, to (1) maintain crystallinity of the implanted layer, (2) enhance the concentration depth profile of implanted species, (3) enhance the diffusion of implanted species, (4) reduce the clustering of implanted species, or (5) improve the subsequent activation (by later anneal process) of the implanted layer. The surface to be implanted may be a single-crystalline bulk wafer or a SOI (silicon-on-insulator) layer. Alternatively, the surface to be implanted may be an amorphized layer of a bulk wafer or SOI wafer, or may be an amorphous or polycrystalline deposited layer over the bulk wafer or over an insulating layer.

The bias power required may be on the order of 10 W-10 KW, the majority of which appears as heat load on the wafer. Initially the ESC cooling is set to a minimal level and the heater power is controlled to maintain the ESC surface at a temperature greater than the target wafer temperature (670 C, with a variation of ~50-100 C). The wafer is introduced on the ESC 14, process gas is introduced and chamber pressure is regulated. Plasma source power and bias power are switched on or ramped on and an ESC voltage is set to control the wafer temperature to the desired 600 degree C. temperature with the added heat load of the plasma source and bias power, while approximately simultaneously the cooling of the heater/ESC is set to a high level to prevent overheating of the ESC/heater. The heater power is varied by the closed loop ESC/heater control system to maintain the heater/ESC at approximately the 660 degree C. setpoint. After the implant process is complete (typically 3 to 60 seconds, depending on target dose and RF voltage), the plasma is extinguished and the cooling of the heater or ESC is set to a low level and the heater power is varied by the closed loop ESC/heater control system to maintain the heater/ESC at approximately the 660 degree C. setpoint.

Such a system may also be used for materials modification processes, surface cleaning processes, deposition processes, or etch processes.

Alternatively or in addition, the wafer to be implanted at high temperature may be pre-heated to high temperature just prior to being transferred to the plasma immersion implantation chamber (in a pre-heat chamber) or may be pre-heated within the plasma immersion implantation chamber prior to implantation, for example by plasma heating. In that case, a non-reactive gas plasma operating with low or no wafer bias (source power only) is used to preheat the wafer, with the wafer 40 thermally isolated from the ESC 14. For thermal isolation, the wafer 40 may be positioned on the ESC 14 without electrostatically clamping it, or the wafer 40 may be positioned on lift pins above the surface of the ESC. After pre-heating the wafer 40, the implantation process is initiated. If the ESC 14 does not include a heater, the process is carried out with the wafer 40 on the ESC 14, but thermally isolated (no electrostatic clamping force) by appropriate ESC voltage selection. If the ESC 14 does include the heater 75 (with adequate temperature control capability), the implant process is carried out as described earlier.

Figure 11A:
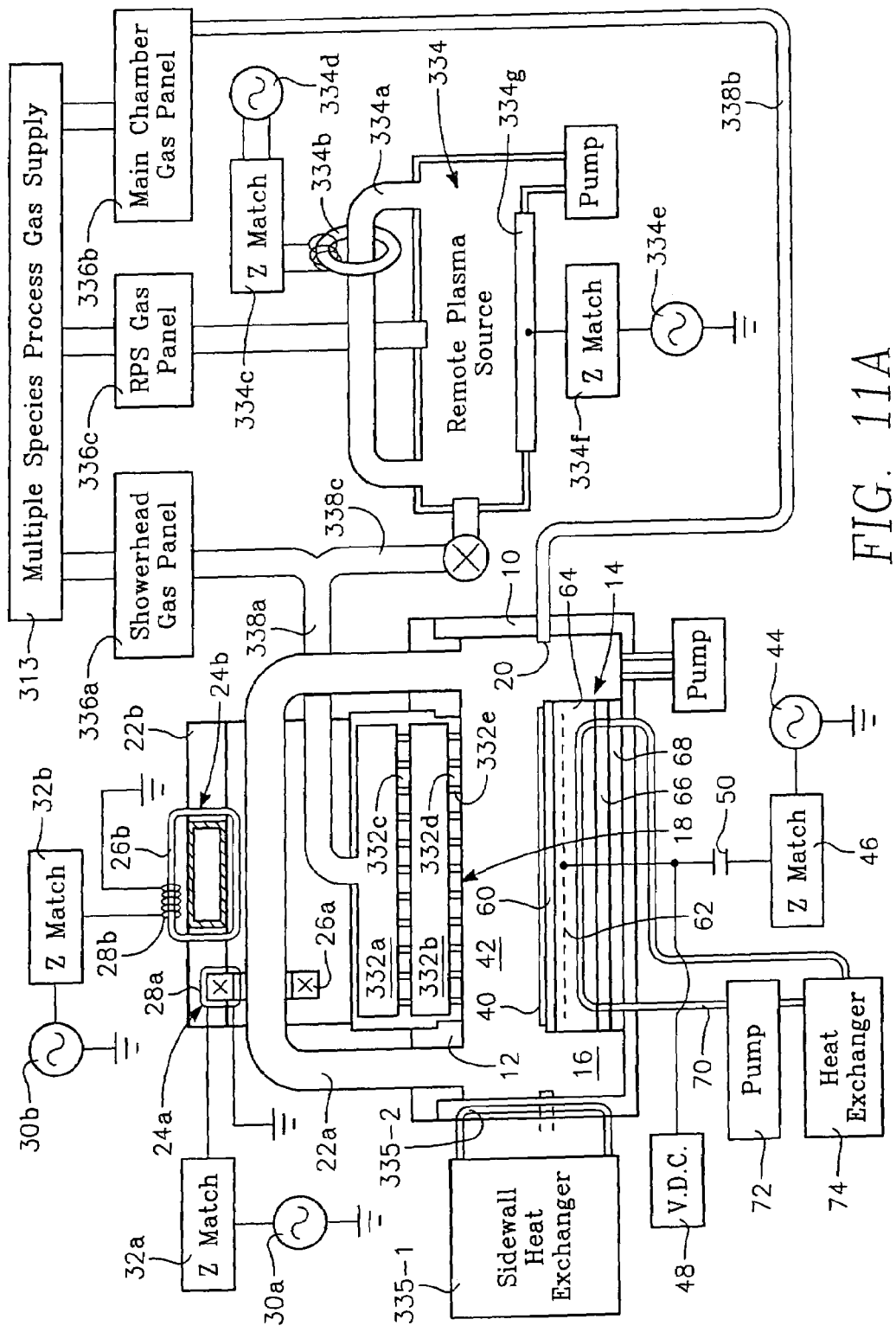
FIGS. 11A and 11B are cut-away side and top views, respectively, of a toroidal source plasma reactor embodying the present invention.
Figure 11B:
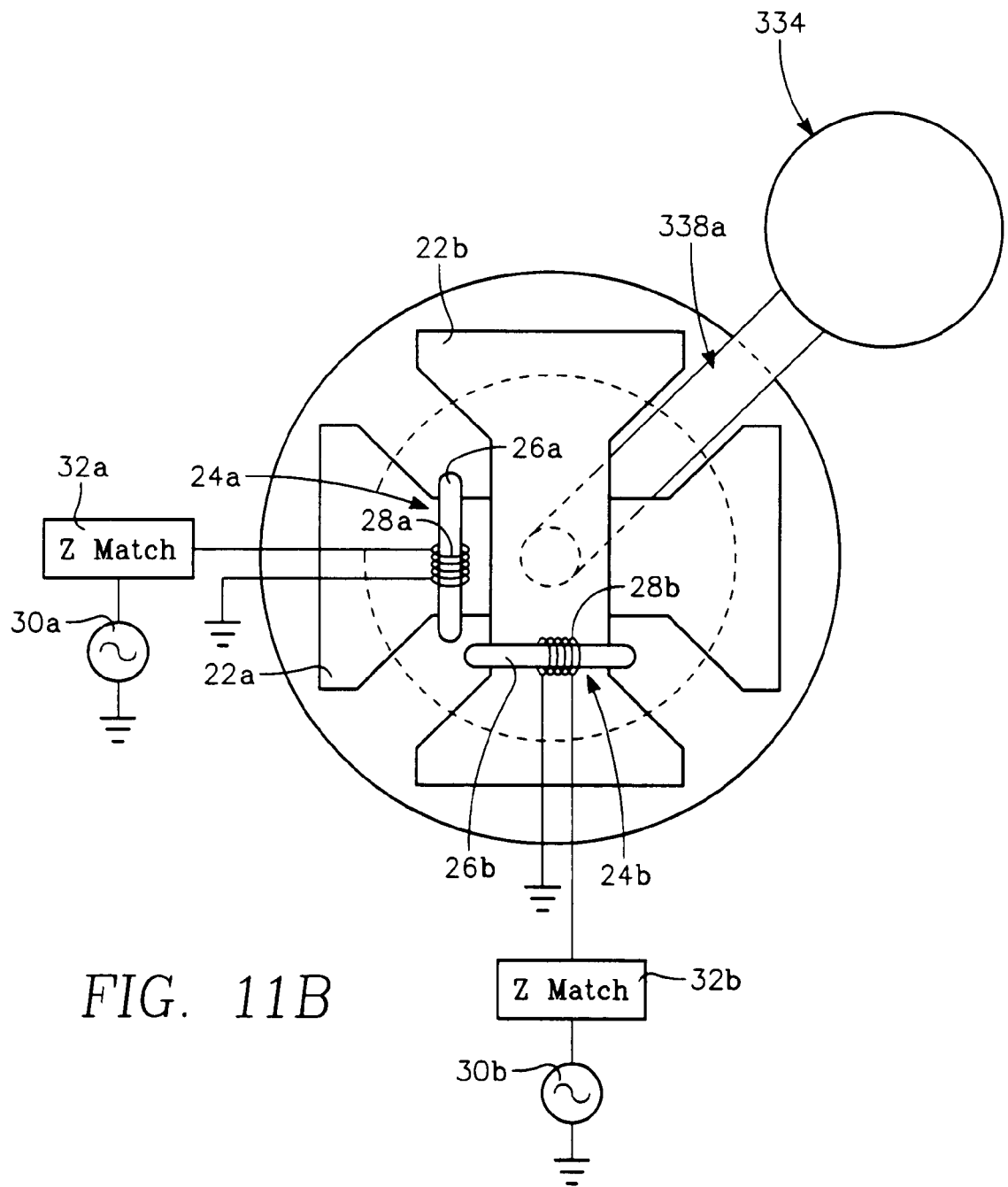

Multi-Mode Plasma and Neutral Processing Toroidal Source Reactor:

FIGS. 11A and 11B are cut-away side and top views, respectively of a toroidal source plasma reactor similar to that illustrated in FIGS. 1 and 2, except that, in FIGS. 11A and 11B, the ceiling showerhead 18 is fed either by radicals from a remote plasma source (RPS) reactor 334 or directly from a process gas supply 313, depending upon the user's choice. Preferably, the wafer support pedestal is a high contact force wafer-cooling electrostatic chuck (ESC) of the type described above with reference to FIG. 1. The main elements of the reactor of FIG. 11A including the wafer support or electrostatic chuck (ESC) 14 are the same as described above with respect to FIG. 1, the same reference numerals being employed in both drawings so that their description need not be repeated here. The toroidal source of FIG. 11A has a pair of transverse external reentrant conduits 22a, 22b with respective RF source power applicators 24a, 24b that include respective toroidal magnetic cores 26a, 26b, respective conductive coils 28a, 28b wound around the magnetic core 26a, driven by respective RF generators 30a, 30b through respective impedance match element 32a, 32b. The ceiling showerhead 18 is surrounded by the toroidal reentrant transverse paths of the oscillating plasma currents excited within the reentrant external conduits 22a, 22b. The reentrant toroidal paths of the oscillating plasma currents pass through the respective reentrant conduits 22a, 22b and through the process region 42 overlying the surface of a wafer 40.

The process gas supply 313 contains different gas species, each of which can be accessed separately. A showerhead gas panel 336a controls the selection and flow rate of gas species from the gas supply 313 to the showerhead 18. The showerhead 18 can have a supply plenum 332a and an output plenum 332b separated by an apertured barrier 332c. The bottom of the output plenum 332b consists of a wall 332d with gas injection holes 332e. A gas conduit 338a receives the process gas and delivers it to the supply plenum 332a. A main chamber gas panel 336b controls the selection and flow rate of gas species from the gas supply 313 to the gas injectors 20 of the main chamber 42 through a gas conduit 338b. An RPS gas panel 336c controls the selection and flow rate of gas species from the gas supply 313 to the RPS reactor 334. A gas conduit 338c conducts plasma products (e.g., excited and/or dissociated neutrals or radicals) from an output port of the RPS chamber 334 to the showerhead-supplying gas conduit 338a. The drawings of FIGS. 11A and 11B show a feed conduit 338a feeding the ceiling showerhead 18 at its center with either radicals from the RPS chamber 334 or process gas from the gas panel 336a. Uniform distribution of excited gas or radicals injected from the showerhead 18 into the main chamber 42 is attained because the radicals from the conduit 338a fill the supply plenum 332a and pass through the apertured barrier 332c to fill the output plenum 332b. Radical distribution in both plenums 332a, 332b is rendered more radially uniform because gas or particle diffusion within the plenums 332a, 332b tends to overcome any distribution non-uniformities. Therefore, the radial distribution of radicals (or process gases) across the array of injection holes 332e is highly uniform and is therefore uniform in the main chamber 42.

While the foregoing description pertains to a mode in which process gases are supplied directly to the supply plenum 332a of the main chamber showerhead 18 unless they are to be first excited or dissociated in the RPS chamber 334, in other modes some (or all) of the process gases may be brought into the plenum 332a behind the showerhead 18 through the remote plasma source 334, even if some (or all) of the process gases are never used with the remote plasma source 334 turned on. For example, one embodiment brings the following gases into the plenum 332a via the RPS 334: O2, N2, H2, He, Ar, NF3. In this way the gas may be excited/dissociated by the RPS source 334, if desired, and operated with or without plasma in the main plasma process chamber below. In a working embodiment, other (depositing) process gases are delivered directly into the plenum 332a, bypassing the RPS 334, but this is not a requirement. Depositing or etching gases may be delivered to the plenum 332a through the RPS 334. There may be an advantage to being able to season the interior of the RPS chamber 334 by bringing depositing gases through it. Of course, etching gases can be brought through the RPS chamber 334 for cleaning the RPS itself, as well as for cleaning the main chamber 42.

The RPS reactor 334 can be any suitable type of conventional plasma reactor, such as a capacitively coupled reactor, an inductively coupled reactor or a toroidal source reactor, and may be a commercially available reactor of the type sold for use as a downstream external plasma source. If it has a toroidal plasma source (e.g., of the type employed in the reactor of FIG. 1), then the RPS reactor 334 has an external reentrant conduit 334a, a power applicator 334b, an impedance match 334c and an RF power generator 334d. It may have a bias power generator 334e coupled through an impedance match 334f to a bias electrode 334g in the RPS reactor 334.

The temperature of the chamber walls including the side wall 10 is controlling independently of the wafer temperature by a heat exchanger/pump 335-1 that pumps heat exchanging fluid through internal fluid passages 335-2 within the side wall 10 (and other chamber walls). In this way the chamber side wall 10 can be set to one temperature and the wafer can be held at another temperature determined by the wafer contact force or applied chucking voltage. As will be discussed below, the chamber walls can be held at a temperature ideal for depositing a high quality (non-flaking) seasoning film (e.g., 20-60 degrees C.) while the wafer temperature can be held at a temperature that is too high for unwanted deposition to take place (i.e., above the deposition threshold temperature for the deposition of carbon polymers on a silicon surface) and that is too low for unwanted etching to take place (i.e., below the etch threshold temperature for a silicon wafer in a fluorine-containing plasma). An advantage is that no time is wasted or consumed while waiting for the temperature of the wafer support or ESC 14 to change before beginning wafer processing. Another advantage is that the wafer temperature can satisfy a processing requirement (e.g., prevention of unwanted deposition during processing and prevention of unwanted etching during processing) while the side wall 10 and ESC 14 can be held at constant temperatures that satisfy both a pre-processing need for deposition of a high quality seasoning film and a post-processing need for rapid removal of the seasoning film. These features are discussed later in this specification.

Multiple Operating Modes of the Reactor:

The gas panels 336a, 336b, 336c can be independently operated to furnish different processes gases simultaneously to the showerhead 18 (directly), to the main chamber gas injectors 20 (directly) and to the RPS reactor 334 so as to furnish neutral species or radicals from the RPS reactor 334 to the showerhead 18. Thus, there are three fundamental operational modes of the reactor as follows which may be carried out singly at separate times or simultaneously, and are as follows: (a) a first process gas (or gas mixture) is delivered to the main chamber gas injectors 20, (b) a second process gas is delivered the showerhead 18, (c) a third process gas is delivered to the RPS reactor 334 which in turn generates radicals or dissociated neutrals that are delivered to the showerhead 18 in lieu of (or in addition to) a process gas from the supply 313. A number of additional modes are carried out by simultaneous combinations of selected ones of the three basic modes (a), (b), (c), above. The multi-mode reactor of FIG. 11A therefore has a number of possible operational modes, some of which will be described below.

Advantages of the Multimode Toroidal Plasma Source Reactor:

One advantage of the coupling of the radical or dissociated neutral stream from the RPS reactor 334 to the main chamber showerhead 18 is that the radial distribution of excited or dissociated neutrals in the main chamber 42 is so highly uniform that the excited or dissociated neutrals may be used not only for chamber cleaning but also for wafer processing. A related advantage is that the uniform radial distribution of excited or dissociated neutrals from the showerhead 18 renders chamber cleaning processes employing excited or dissociated neutrals highly uniform. This reduces consumption of chamber interior materials during cleaning processes and permits the chamber cleaning process to be accomplished more quickly.

Processing wafers in a reactor having a toroidal plasma source with a excited or dissociated neutral species (injected with uniform radial distribution through the showerhead 18) solves the problem of performing rapid wafer cleaning in the toroidal source reactor without roughing or compromising the quality of the wafer surface. In addition, plasma-based wafer processes (such as plasma immersion ion implantation) may be carried out in the same chamber before or after wafer cleaning with excited or dissociated neutral species, eliminating any necessity of removing the wafer from the chamber to perform both processes. Examples discussed below in this specification include pre-implant wafer oxide removal, post-implant photoresist strip or deposition removal, and materials enhancement using radicals. An advantage of performing pre-implant wafer oxide removal in the multi-mode chamber of FIG. 11A is that the implant process can be performed immediately after oxide removal and before the native oxide can return. (In conventional processes, pre-implant wafer oxide removal is an acid dip step, and the native oxide returns to some extent during wafer transport from the acid dip to the implant reactor.)

Figure 12:
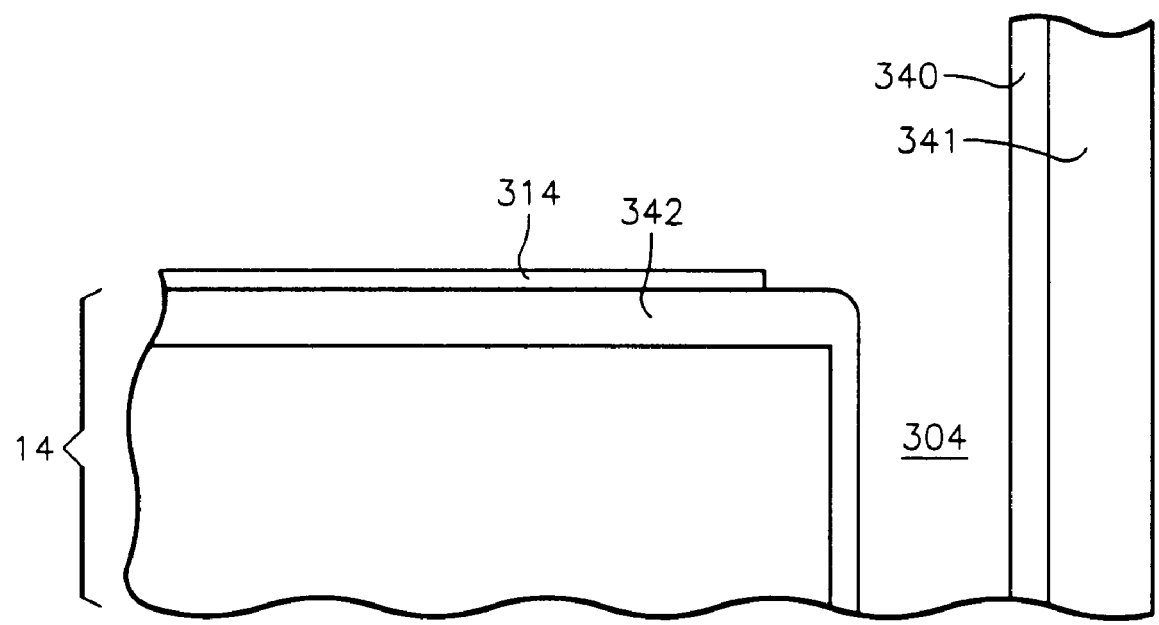
FIG. 12 illustrates a seasoning film deposited on a chamber interior wall surface of the reactor of FIG. 11A and a cushioning film deposited on the wafer support surface of the electrostatic chuck of the reactor of FIG. 11A.

Another advantage is the rapid deposition and removal of an interior chamber seasoning film before and after wafer processing. Referring to FIG. 12, a thin seasoning film 340 (e.g., several hundred angstroms to several microns in thickness) may be deposited on the chamber walls or sidewall 10 (and other interior surfaces, such as the workpiece support or electrostatic chuck 14) so that all interior chamber surfaces are coated with the film 340. This film consists of a process-compatible material, and prevents the process-incompatible materials constituting the chamber interior elements and walls (such as aluminum, aluminum oxide aluminum nitride, stainless steel) from entering or contaminating the process. It also prevents consumption of those elements during plasma processing. As disclosed in both above-referenced parent applications, a thin process-compatible seasoning film may be deposited on the chamber interior surfaces prior to introduction of the wafer, in order to prevent process contamination from metallic particles. Preferably, the seasoning film contains a significant amount of the reactive species of the process gas, to render the seasoning layer less-reactive or non-reactive with the process gas during wafer processing. For example, for processes involving nitrogen-containing process gases, a silicon nitride film may be employed. For processes involving oxygen-containing process gases, a silicon dioxide film may be employed. For processes involving a fluorinated or hydrated dopant gas, the seasoning film may be a fluorocarbon polymer or a hydrocarbon polymer (respectively). Avoiding a combination of fluoride and hydride radicals or ions in the chamber prevents excessive etching of either the wafer during wafer processing or of the chamber interior during chamber cleaning processes.

A new seasoning film may be deposited on the chamber interior surfaces and then a batch of wafers may be processed in succession within that chamber before the seasoning film is removed and replaced with a new seasoning film. However, it is felt that the best protection from contamination is realized by applying a new seasoning film each time a wafer is to be introduced into the chamber, and then removing the seasoning film after processing of that wafer. To avoid significant productivity loss from this procedure, the seasoning film deposition and removal steps must be performed in less time than the time required to perform the wafer process (or less than a fraction of the wafer process time). Rapid deposition of a high quality seasoning layer prior to wafer processing is best accomplished in a deposition precursor gas using the toroidal plasma source of the reactor of FIG. 11A. Rapid removal of the seasoning film 340 after wafer processing without excessive consumption of interior chamber materials is accomplished by cleaning the chamber with radicals injected through the showerhead 18 from the RPS reactor 334. Such measures have reduced the pre-processing seasoning deposition and the post-processing seasoning removal to about 15 seconds.

Another process that is efficiently carried out in the multi-mode reactor, but which can be performed in any reactor, eliminates or reduces backside wafer contamination that is occasioned by mechanical interaction or contact between the wafer backside and the surface of the wafer support pedestal or electrostatic chuck (ESC) 14. The process for reducing or eliminating wafer backside contamination consists of depositing an elastic film 342 (FIG. 12) on top of the wafer pedestal or ESC surface before the wafer is introduced. For best results, this process should be carried out with a high contact force wafer-cooling ESC of the type described above with reference to FIG. 1, in which the top surface is smooth and uninterrupted by open gas channels. In a conventional ESC, such open gas channels are required to accommodate a thermal conductance-enhancing gas (e.g., helium). The ESC of FIG. 1 is gasless (i.e., uses no thermal conductance-enhancing gas, such as Helium, between the wafer and the chuck), and high thermal conductance is achieved by high wafer contact force to the ESC (as described above with reference to FIG. 1). The combination of the flat uninterrupted ESC surface and the elastic film reduces or eliminates wafer backside contamination. The elastic film is preferably a process compatible material, such as a carbon-based polymer. For example, in processes employing either a fluorinated or hydrated process gas, the elastic cushion layer can be a fluorocarbon polymer or a hydrocarbon polymer, respectively.

Deposition of the elastic film 342 on the ESC surface may be preceded by initially depositing a hard protection layer, such as an oxide or nitride film, and thereafter depositing the elastic cushion layer or film 342. In this way, the ESC wafer support surface has an underlying hard protection layer (not shown) covered by the elastic film 342.

For optimum results, the cushion film should be removed from the ESC after each wafer is processed and a new cushion film should be deposited before processing of the next wafer. This requires rapid film deposition and removal to avoid a significant impediment to productivity. The most rapid deposition process for a polymer cushion film on the ESC is a plasma enhanced CVD process, and the most rapid removal process with minimum consumption of chamber interior materials is a cleaning process using radicals or dissociated neutrals (e.g., one or more of oxygen, nitrogen, hydrogen, fluorine) from the RPS reactor 334.

The problems of plasma immersion ion implantation etching the surface being implanted and/or depositing an implant-inhibiting film formed from the ion implant process gas are solved by maintaining the wafer temperature during implantation within a temperature range at which both etching of the surface being implanted and deposition of a film are inhibited or prohibited. Specifically, the wafer temperature range is above the threshold temperature for deposition of the material formed from the process gas (e.g., a polymer-like boron hydride material, for example) and below the threshold temperature for etching the surface (typically, crystalline, polycrystalline or amorphous silicon). The wafer may be maintained within this optimal temperature range regardless of plasma heat load using the gasless ESC that establishes high thermal conductivity by maintaining a large electrostatic contact force between the wafer and the ESC. The etch and deposition behavior at the wafer surface is determined by both the wafer temperature and the plasma bias voltage on the wafer, as well as the plasma conditions (gas chemistry, flow rates, process pressure, source power). Specifically, the threshold etch temperature and the threshold deposition temperature are different for different wafer bias voltage levels. If the wafer process to be performed is a plasma immersion ion implantation process, then the bias voltage must be set to attain the required ion implantation depth or depth profile. This fixes the etch and deposition threshold temperatures for a given process chemistry and set of process conditions (e.g., chamber pressure). Thereafter, the wafer temperature is set (by setting the ESC wafer clamping force) to a value lying above the threshold deposition temperature and below the threshold etch temperature. We have found that this temperature range depends upon the process gas chemistry. For example, the greater tendency of fluoride dopant gases to etch decreases the requisite temperature range. The greater tendency of hydride dopant gases to deposit a film in the wafer increases the requisite temperature range. As a result, the ideal "no etch/no deposition" wafer temperature range is generally lower for fluoride dopant gases and is generally higher for hydride dopant gases. This will be seen in some of the working examples given below in this specification.

The "no etch/no deposition" wafer temperature range may further be modified by adding another dilution gas. For example, for a dopant hydride implantation process, hydrogen may be added (as a dilution gas) to reduce deposition at a given wafer temperature and implantation voltage. Conversely, hydrogen may be added to allow lower wafer temperature without deposition. If sufficient hydrogen is added to the dopant hydride implantation process, etching of the implanted surface may result. If this is excessive, the wafer temperature may be reduced to suppress etching.

Hydrogen may alternatively or additionally be added to suppress oxidation of the wafer surface which can occur during implantation. Oxidation of the implanted surface, of a dopant-rich layer in the implanted surface or of a thin deposited dopant-containing layer, may trap dopant species at or near the surface, limiting subsequent dopant diffusion and/or activation. Hydrogen may be added to (1) reduce oxidation, (2) enhance the concentration depth profile of implanted species, (3) enhance the diffusion of implanted species, (4) reduce the clustering of implanted species, or (5) improve the subsequent activation (by later anneal process) of the implanted layer. The hydrogen dilution gas may be H2 or another suitable hydrogen-containing gas.

Hydrogen may be added as the diluent gas in dopant-fluoride implantation processes. While this addition may not improve etching loss of the implanted surface, hydrogen may be added to (1) reduce oxidation, (2) enhance the concentration depth profile of implanted species, (3) enhance the diffusion of implanted species, (4) reduce the clustering of implanted species, or (5) improve the subsequent activation (by later anneal process) of the implanted layer.

Co-implantation (simultaneous or sequential) of dopant species (such as a dopant hydride or a dopant fluoride, e.g., B2H6 or BF3) with a deposition species, such as SiH4, GeH4, SiF4 or GeF4 may be useful in (1) compensating etch loss, (2) enhancing the concentration depth profile of implanted species, (3) enhancing the diffusion of implanted species, (4) reducing the clustering of implanted species, or (5) improving the subsequent activation (by later anneal process) of the implanted layer.

Figure 13:
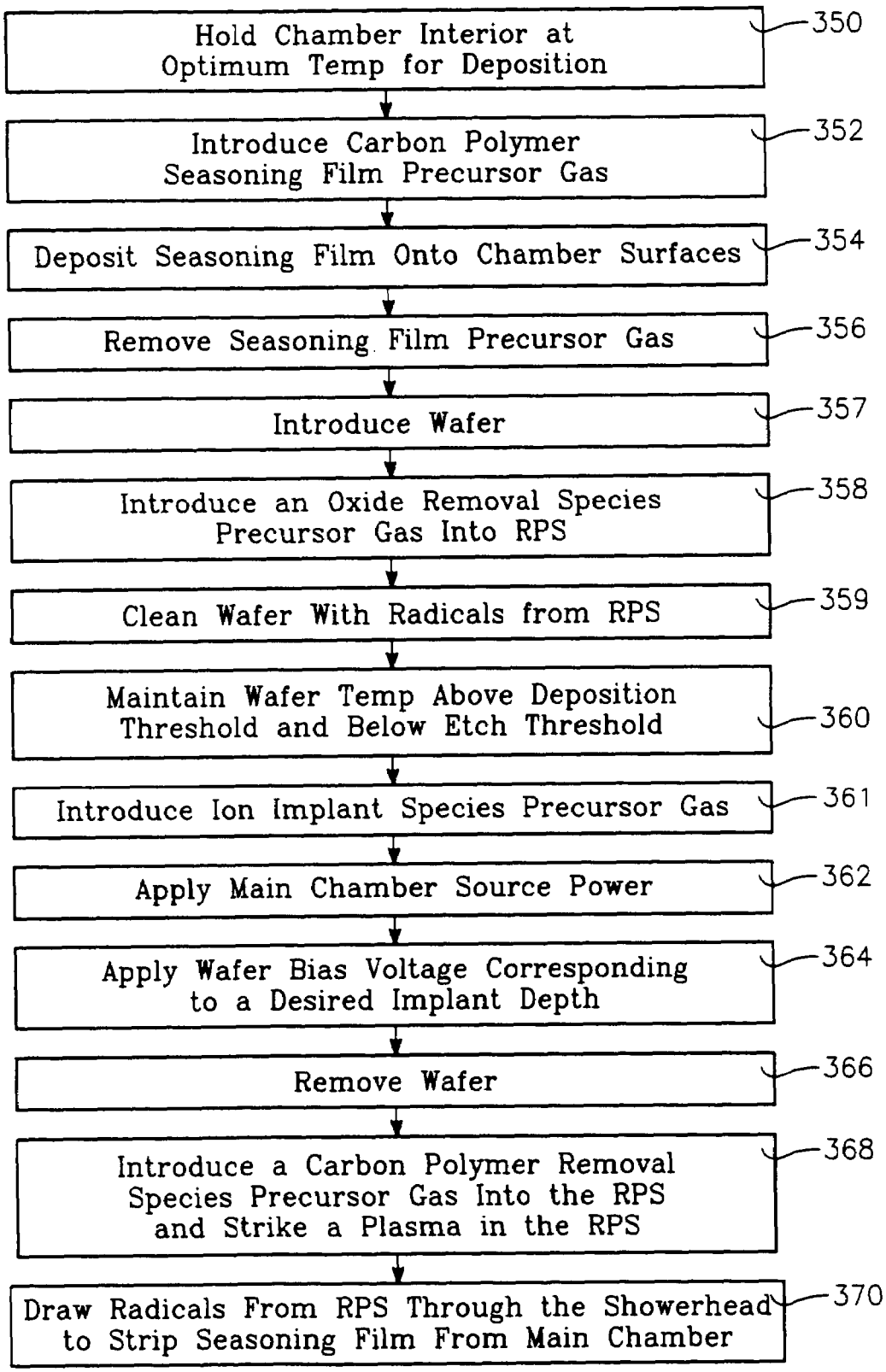
FIG. 13 is a block flow diagram illustrating a plasma immersion ion implantation process.

Processes Performed in the Multi-Mode Reactor:

Referring to FIG. 13, the multi-mode reactor of FIG. 11A can efficiently carry out a complete ion implantation process in which the chamber interior is quickly seasoned, the wafer is cleaned by radicals injected through the showerhead, plasma immersion ion implantation is performed, and the chamber seasoning is removed by radicals injected through the showerhead. While the foregoing contemplates the cleaning processes (i.e., the process for cleaning or deoxidizing the wafer and the process for cleaning or removing the seasoning layer from the chamber interior surfaces) are carried out by introducing radicals or excited neutrals from the RPS chamber 334, either or both such cleaning processes could be carried out without the RPS chamber by introducing cleaning precursor species in to the main chamber 42 and striking a plasma in the main chamber 42. Alternatively, either or both such cleaning process could be carried out by a combination of both excited neutrals from the RPS chamber 334 introduced into the main chamber 42 and a plasma of cleaning species in the main chamber 42.

In the step of block 350 of FIG. 13, the chamber interior surfaces such as the side wall 10 are held at a temperature sufficiently low (e.g., 60-75 degrees C.) to promote chemical vapor deposition of a high quality (non-flaking) seasoning film consisting of a process-compatible material such as a fluorocarbon polymer or a hydrocarbon polymer. This can include the ESC top surface, which is also held at a low temperature suitable for deposition. The wafer temperature can be different (e.g., about room temperature to over 1000 degrees C., if a heater/ESC is used) during the subsequent wafer processing, depending upon the electrostatic or clamping force applied by the ESC 14 to the wafer and the wafer heat load and thus plasma source and bias power, without having to change the temperature of the ESC. The advantage is that no time is wasted or consumed while waiting for the ESC temperature to change before beginning wafer processing. Another advantage is that the wafer temperature can satisfy a processing requirement (e.g., prevention of unwanted deposition during processing and prevention of unwanted etching during processing) while the wall and ESC temperature can be held at a constant temperature that satisfies both a pre-processing need for deposition of a high quality seasoning film and a post-processing need for rapid removal of the seasoning film.

In the next step of FIG. 13 (block 352), a seasoning film precursor gas is introduced into the main chamber 42, either through the ceiling showerhead 305 or through the side gas injection nozzles 20. The precursor gas can be a fluorocarbon or hydrocarbon gas for a polymer seasoning film, a combination hydrocarbon/fluorocarbon gas for combined hydrofluorocarbon film, a polymer enhanced with Si, Ge, B, P, or As using hydrides or fluorides of said materials, a mixture of nitrogen and silane for a silicon nitride film, silane and oxygen for a silicon dioxide film, silane or silane plus hydrogen for a silicon or silicon hydride film, or other suitable gases or gas mixtures. If the ion implantation is to be performed with a fluorinated or hydrated dopant gas, then the preferred seasoning film is a fluorocarbon or hydrocarbon, respectively. Next, a plasma-enhanced chemical vapor deposition step is performed (block 354) by applying plasma source power to the external conduits 22a, 22b of the main chamber. The seasoning precursor gas is removed (block 356) and a wafer is placed on the ESC 14 (block 357). A pre-implant wafer clean process is performed by introducing an oxide removal species precursor gas (such as hydrogen) into the RPS chamber 334 (block 358 of FIG. 13) and applying plasma source power to the RPS chamber 334 to generate radicals that are fed through the showerhead 305 into the main chamber, and perform a radical-based cleaning or oxide removal process on the wafer 40 (block 359 of FIG. 13). The radical-based cleaning removes the wafer oxide in a relatively gentle manner that avoids damaging or degrading the smooth surface of the wafer. The wafer is maintained at the desired process temperature—e.g., below the etch threshold temperature and above the deposition threshold temperature—(block 360) and an ion implant species precursor gas is introduced (block 361) into the main chamber 42. Source power is applied (block 362) and bias power is applied (block 364), the bias power being sufficient to impart an ion energy corresponding to the desired implant depth and carry out the plasma immersion ion implantation step.

The wafer is removed from the chamber (block 366) and a seasoning film removal species precursor gas (e.g., oxygen-containing gas such as O2 for removing a fluoro- or hydrocarbon polymer seasoning film (possibly in combination with one or more of hydrogen, fluorine or nitrogen containing gas such as H2, NF3, N2, NH3), or NF3 or NH3 for removing other materials) is introduced into the RPS chamber 334 (block 368). The radicals produced in the RPS chamber 334 are drawn into the main chamber 42 to carry out a seasoning removal step which cleans all of the chamber interior surfaces (block 370). In order to maintain an adequate flow of radicals from the RPS chamber 334 to the main chamber 42, the main chamber 42 may be maintained at a lower pressure than the RPS chamber 334. The radicals or dissociated neutrals efficiently remove the seasoning film from the internal chamber surfaces in a manner that is relatively gentle and avoids excessive consumption of chamber interior materials. Alternatively or additionally, plasma source power may be applied to generate a cleaning plasma within the chamber.

Figure 14:
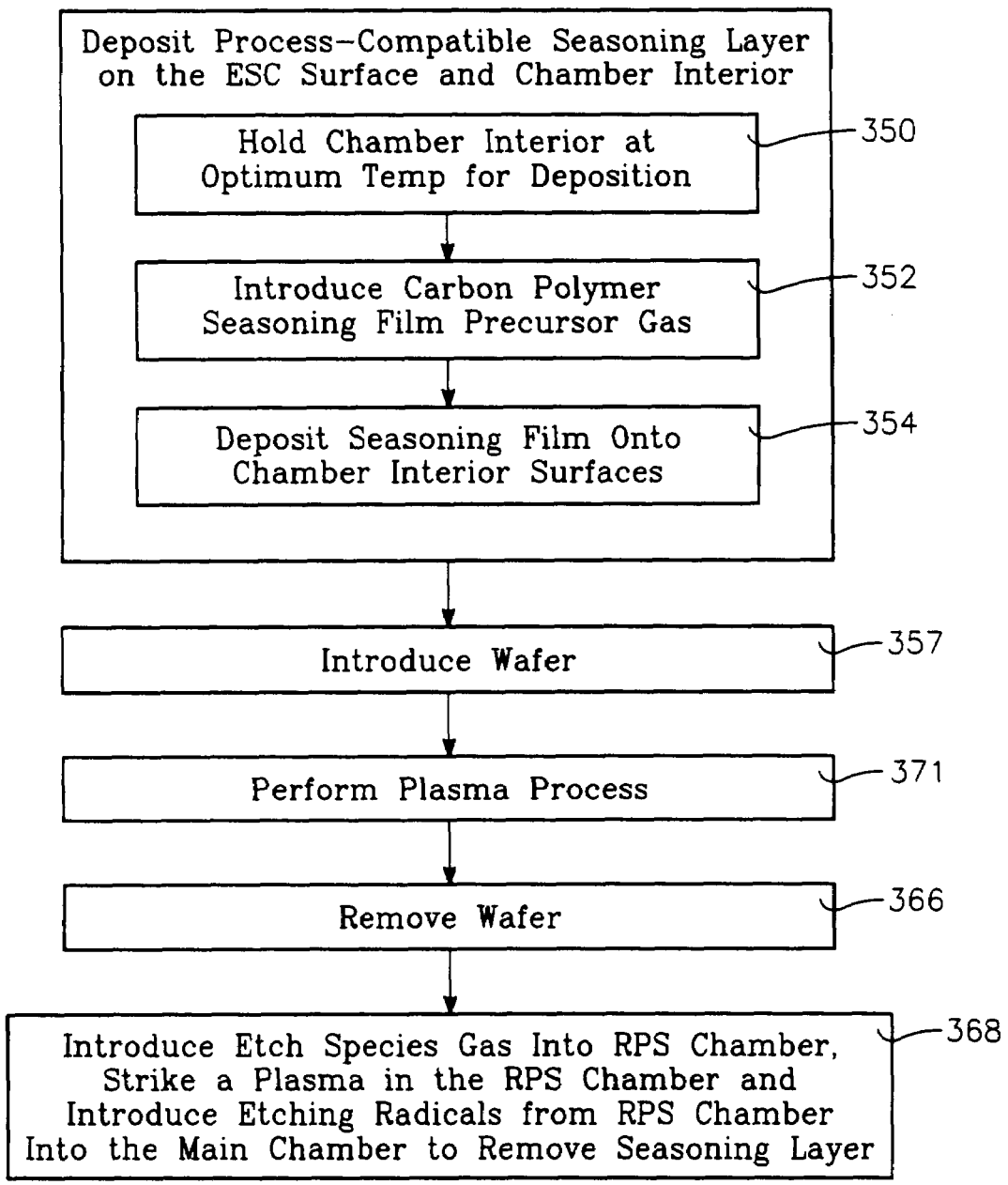
FIG. 14 illustrates a wafer processing method employing a pre-process chamber seasoning step for low contamination.
Figure 15:
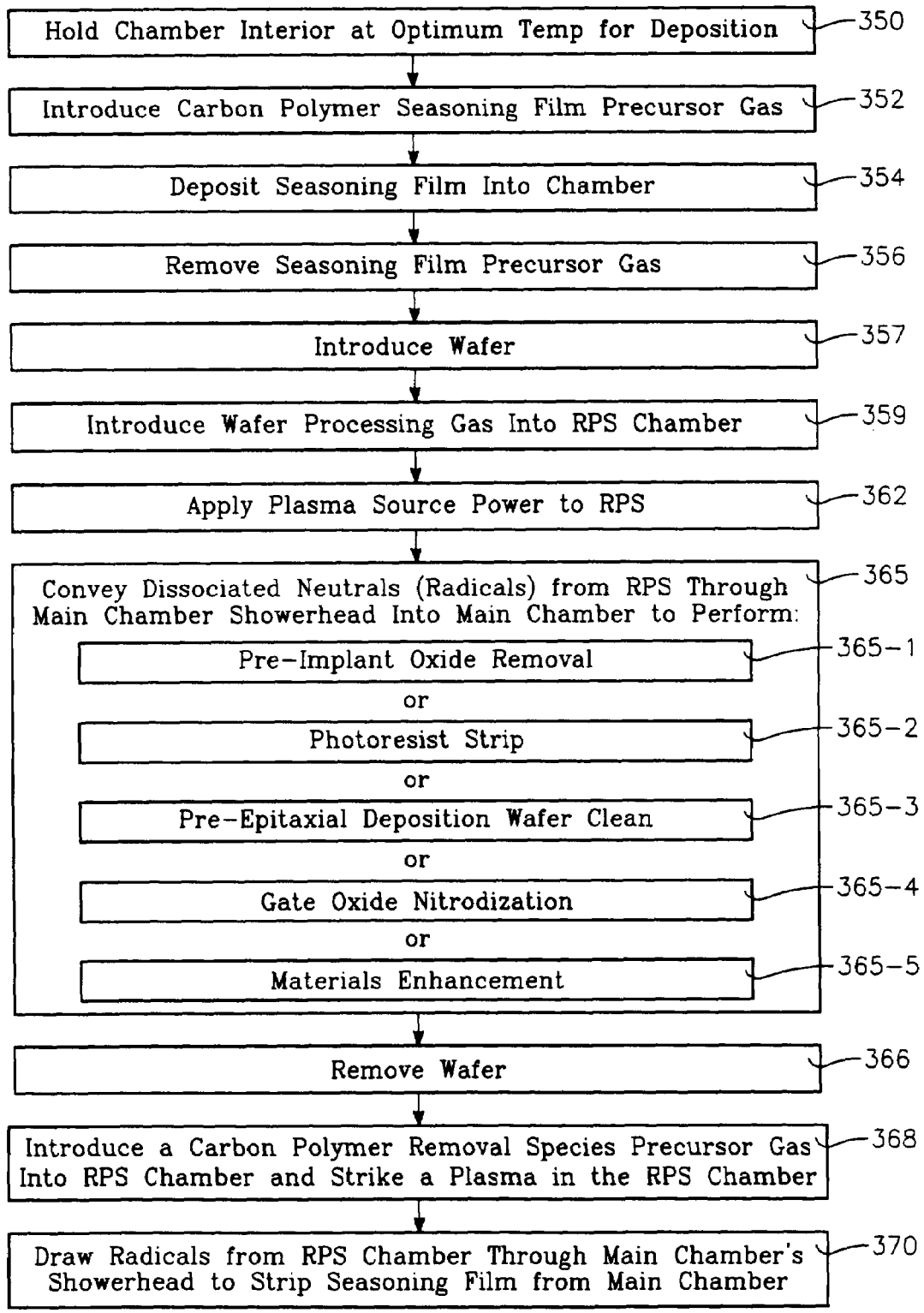
FIG. 15 illustrates a wafer processing method in which radicals or dissociated neutrals are introduced from a remote plasma source into the main plasma chamber of FIG. 11A through the gas distribution showerhead.

The seasoning film may be deposited on the chamber interior surfaces of the multi-mode reactor of FIG. 11A prior to wafer processing and removed after wafer processing in connection with any suitable type of wafer process. This general concept is illustrated in FIG. 14. First, the seasoning layer is deposited on the chamber interior surfaces, which is the block in FIG. 14 labeled 350, 352, 354 corresponding to the identical steps of FIG. 13. The wafer is introduced (block 357 of FIG. 14) and a wafer process is performed in the chamber (block 371 of FIG. 14). Thereafter, the wafer is removed (block 366 of FIG. 14) and radicals (from the RPS chamber 334) are introduced through the showerhead 18 to remove the seasoning film from the chamber interior surfaces (block 368 of FIG. 14). The multi-mode reactor is particularly useful in cases where the wafer process of block 371 requires radicals to carry out. In such a case, the multi-mode reactor of FIG. 11A provides highly uniform distribution of radicals across the wafer surface because the showerhead 18 injects the radicals in a highly uniform manner. FIG. 15 illustrates such a process.

Referring to FIG. 15, a seasoning film is deposited on the chamber interior surfaces in the steps are blocks 350, 352, 354 and 356, which have been described above with reference to FIG. 13. The next step is to introduce a wafer (block 357) and a processing precursor gas into the RPS chamber 334 (block 359) and apply plasma source power to the RPS chamber 334 (block 362 of FIG. 15). The dissociated neutrals flow from the RPS chamber 334 through the showerhead 18 and into the main chamber 42 to support a wafer processing step (block 365). The wafer process of block 365 may be any suitable process that employs radicals or dissociated neutrals. For example, the process may be any one of the following: a pre-implant wafer oxide removal process (block 365-1), a photoresist strip process (block 365-2), a wafer cleaning process carried out immediately before deposition of an epitaxial layer (block 365-3), gate oxide nitridation in a radical mode (block 365-4), or materials enhancement (block 365-5).

The pre-implant wafer oxide removal process of block 365-1 may be carried out with hydrogen radicals. The photoresist strip process of block 365-2 may be carried out with oxygen radicals. The pre-deposition wafer clean process of block 365-3 may be carried out with fluorine, hydrogen, ammonia or oxygen (or possibly oxygen+nitrogen) radicals, depending upon the film composition then present on the wafer. The gate oxide nitridation step of block 365-4 may be carried out with nitrogen radicals for a silicon dioxide gate insulator layer, using for example, N2 or NH3. The materials enhancement process of block 365-5 may be carried out with fluorine radicals for treating a tantalum or titanium gate electrode, using for example, F2, NF3, SiF4, or a fluorocarbon gas. As a further application, plasma or radical oxidation may be used for oxide growth, such as for gate oxide grown at low temperature (as compared with pure thermal gate oxide growth process). One example of such an application uses O2 and/or water vapor to grow plasma oxide at a wafer temperature of 600 degrees C., using O2 plasma generated in the main chamber 42 or O2 radicals from the RPS 334.

Upon completion of the wafer process of block 365, the wafer is removed from the reactor (block 366 of FIG. 14) and the chamber seasoning film is removed in the steps of blocks 368 and 370 using radicals from the RPS chamber 334, as described above with reference to FIG. 13.

Figure 16:
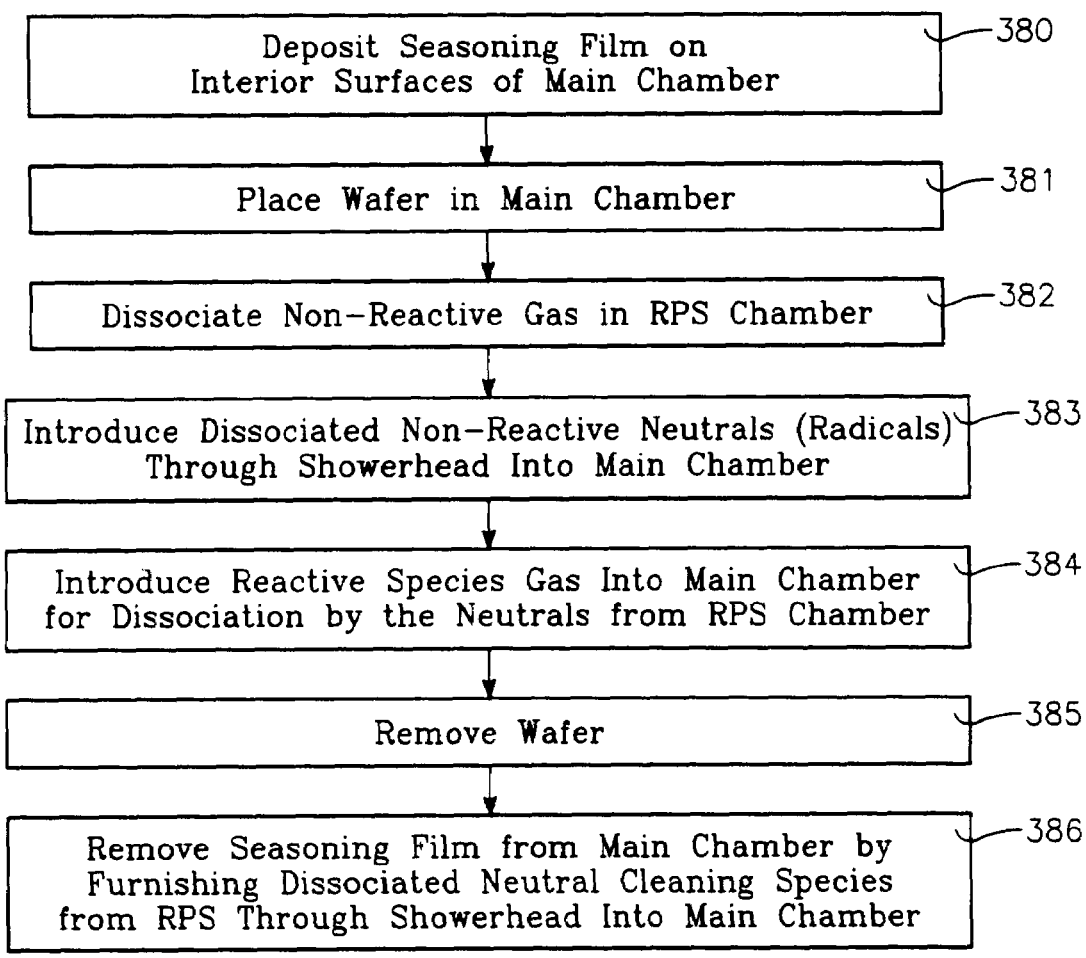
FIGS. 16 and 17 illustrate wafer processes performed by the multimode reactor of FIG. 11A that use both the RPS reactor source power and the main chamber source power simultaneously.
Figure 17:
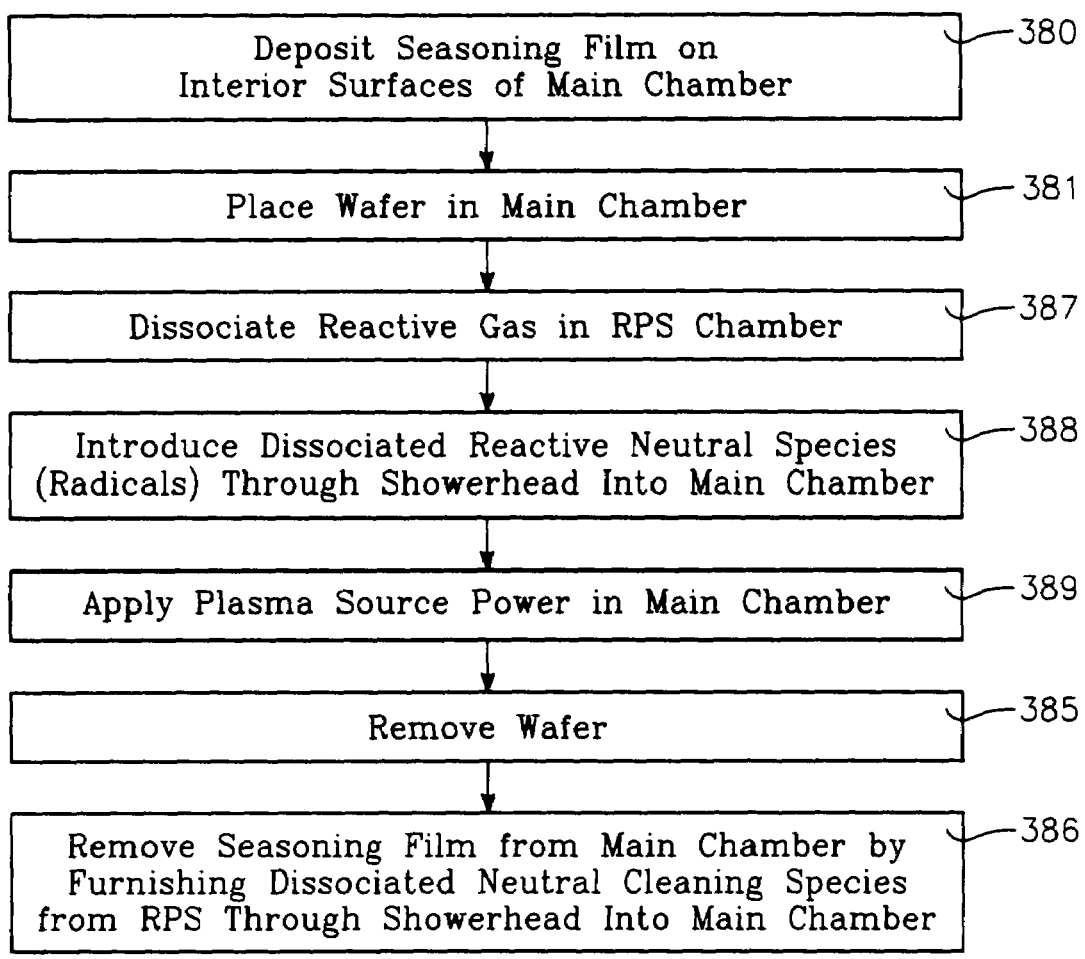

The multi-mode reactor of FIG. 11A may be operated in more than one its basic modes simultaneously. FIGS. 16 and 17 illustrate processes that use both the RPS reactor source power and the main chamber source power simultaneously. In the process of FIG. 16, a non-reactive species gas is introduced into the RPS reactor 334 while a reactive species gas is introduced into the main chamber 42 through the side nozzles 20. Source power is applied to both chambers 42, 334. The excited non-reactive gas species generated in the RPS chamber 334 enter the main chamber 42 through the showerhead 18. Some of the excited non-reactive gas atoms or molecules collide inelastically with the reactive species and may dissociate the reactive species. This assists the main chamber source power in generating a plasma and may possibly reduce the amount of source power required in the main chamber. In FIG. 16, the first step is to season the reactor chamber interior (block 380). A wafer is placed on the ESC 14 (block 381). A non-reactive gas is introduced into the RPS chamber 334 and source power is applied in the RPS chamber to excite the non-reactive gas (block 382) to produce excited non-reactive gas species that enter the main chamber through the showerhead 18 (block 383). Simultaneously, a reactive species precursor gas is introduced into the main chamber (block 384) which is dissociated by collisions with the excited non-reactive gas species that entered through the showerhead 18. If the energy of the excited non-reactive gas species is sufficient, it may be unnecessary to apply any plasma source power in the main chamber 42. However, a modest amount of source power applied to the main chamber 42 produces a plasma with the desired ion density. This step carries out a plasma-enhanced wafer processing step. Upon completion, the wafer is removed (block 385) and the seasoning layer is removed from the chamber (block 386) preferably in the manner described above using radicals from the RPS reactor 334.

In the process of FIG. 17, a reactive gas is dissociated in the RPS chamber to provide dissociated reactive species or radicals through the showerhead 18 into the main chamber. Referring now to FIG. 17, the process of FIG. 17 can include initially coating the chamber interior with a seasoning film (block 380) before the wafer is introduced (block 381) as in the process of FIG. 16. A reactive gas is dissociated in the RPS chamber 334 (block 387) to provide dissociated reactive species or radicals through the showerhead 18 into the main chamber 42 (block 388). Simultaneously, plasma source power is applied in the main chamber to ionize a portion of the radicals in the main chamber (block 389). The wafer is therefore exposed to both radicals and ions in a desired proportion. This process is particularly useful for a process in which a layer is to be doped with a material-enhancing species to a precise depth. The use of radicals in this process provides good depth control, while the use of ions in the process can enhance productivity where the required depth is relatively great. One example is the enhancement of a thick gate oxide layer (such as hafnium oxide) with fluorine atoms to modify the gate oxide dielectric constant. In such a process, the depth profile of the fluorine atoms is critical because the underlying semiconductor layer cannot tolerate contamination with fluorine. Another example is the enhancement of a tantalum or titanium gate with fluorine atoms to modify the metal work function. The foregoing is followed by removing the wafer upon completion of the wafer process (block 385) and then removing the chamber seasoning film (block 386).

Figure 18:
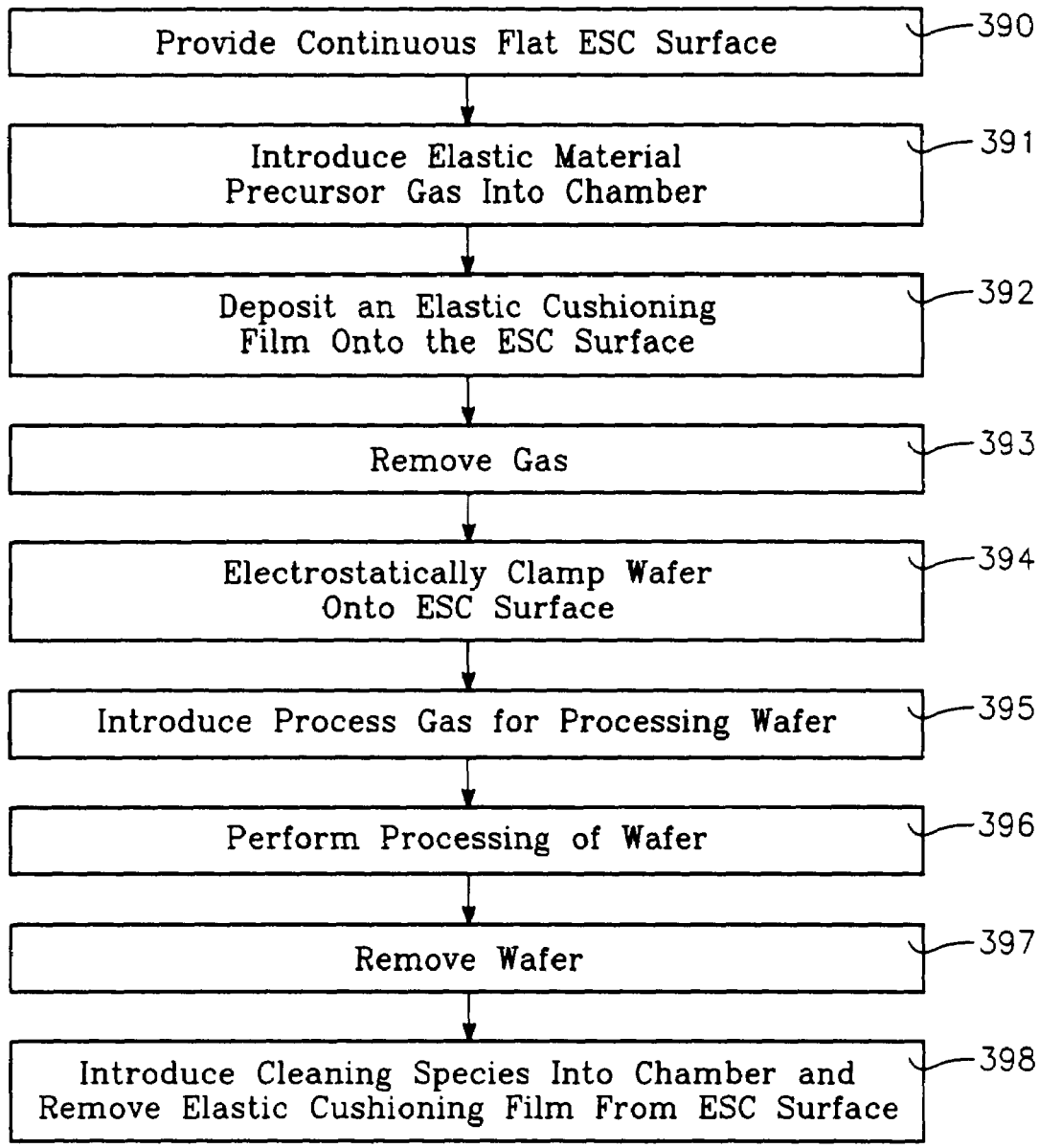
FIG. 18 illustrates a process that can be carried out in any plasma reactor for eliminating or reducing contamination.

FIG. 18 illustrates a process that can be carried out in any plasma reactor for eliminating or reducing contamination. The process is best carried out, however, by first providing (block 390 of FIG. 18) a polished flat continuous wafer support surface on the reactor's wafer support pedestal in the chamber. Preferably, the wafer support pedestal is an electrostatic chuck (ESC) having such a continuous polished surface, and may be of the type described in detail above with reference to FIGS. 1-10 that is free of any open gas channels in its top surface. This type of ESC can be used with any type of plasma source to carry out the process of FIG. 18 in a reactor chamber, including a toroidal plasma source (as in FIG. 11A), an inductively coupled source, a capacitively coupled source or a microwave source or other source. A gas containing the precursor of an elastic material is introduced into the reactor chamber (block 391 of FIG. 18). The elastic material may be a fluorocarbon polymer, a hydrocarbon polymer or a fluoro-hydrocarbon polymer, and the precursor gas is then a fluorocarbon gas, a hydrocarbon gas or a fluoro-hydrocarbon gas or mixture, respectively. A plasma is generated from the process gas while the chamber pressure, gas flow rate and surface temperature of the ESC are set to promote chemical vapor deposition of the elastic material onto the wafer-supporting surface of the wafer support pedestal (block 392 of FIG. 18). The elastic material forms a cushioning film on the ESC that will prevent harsh contact and scraping between the wafer backside and the top surface of the ESC. After the cushioning layer has reached a desired thickness (e.g., several hundred angstroms to several microns), the process gas is removed from the chamber (block 393) and the wafer is introduced into the chamber and placed on the cushioning layer formed on the ESC (block 394 of FIG. 18). If the wafer support pedestal is an ESC, then the wafer is electrostatically clamped over the cushioning layer. A wafer process is then carried out (block 395 of FIG. 18) by introducing a suitable process gas into the chamber and coupling plasma source power into the chamber (or by introducing dissociated neutrals from an RPS chamber). Required process conditions are maintained in the chamber until the wafer process has been carried out (block 396). Then, the wafer is removed (block 397), and the cushioning layer is removed from the wafer support pedestal by introducing a cleaning species precursor process gas into the chamber (block 398). Preferably, the cleaning species precursor process gas has been dissociated prior to its introduction into the reactor chamber, and very little or no plasma source power is required to remove the cushioning film from the wafer support pedestal. Alternatively, the cleaning species is generated within the process chamber by application of plasma source and/or bias power.

Three-Element Independent Temperature Control:

The high contact force ESC of FIGS. 1-10 controls the wafer temperature separately from the ESC temperature and independently of the chamber wall temperature, permitting these three elements to be held at three different temperatures. This feature facilitates rapid deposition and removal of the chamber seasoning film to meet the twin requirements of high productivity and low metal contamination or particle count on the wafer, as will be explained below.

The wafer temperature is determined by a balance between the electrostatic contact force-induced thermal conductivity to the ESC, the ESC temperature and the plasma heat load. Thus, the ESC can be at one temperature while the wafer can be at a higher temperature, depending upon the electrostatic contact force. The greater the ESC-wafer contact force, the closer the wafer temperature is to the cooler ESC temperature. The only requirement for the ESC temperature is that it be sufficiently cool to enable temperature control of the wafer. This permits the wafer temperature, the ESC temperature and the chamber wall temperature to be different from one another. These three different elements (the wafer, the walls and the ESC) can meet different temperature requirements. The wafer is preferably held at a temperature that satisfies the requirements of a particular wafer process recipe. This can be as high as 600 degrees C. or higher to prevent amorphization during an ion implantation process, as one example. Or, if a hydride or fluoride dopant gas is employed for dopant implantation, the wafer temperature can be sufficiently low (e.g., about 5 degrees C.) to avoid etching of the wafer and sufficiently high to avoid deposition of a polymer-like film (e.g., BH3). The chamber walls are preferably held at a temperature at which a high quality chamber seasoning film can be rapidly formed and later rapidly removed. This may be about 20-80 degrees C. depending upon the seasoning film chemistry. The ESC 14 is preferably held at a temperature that is sufficiently cool to meet plasma heat load on the wafer and which promotes rapid deposition of a high quality cushioning film on its wafer support surface and/or a seasoning film on all its surfaces, and removal of such films within a reasonable time. An optimum ESC temperature therefore may be less than the temperature of the chamber walls, and is preferably in the range of −20 to +60 degrees C.

The seasoning film and/or cushioning film is preferably deposited and removed very rapidly in order to permit its frequent replacement without excessively reducing productivity (relative to conventional processes in which no seasoning film is periodically removed and replaced). For this reason, it is preferred that the chamber seasoning deposition and removal time be on the order of the wafer process time (or less). For wafer process times on the order of a minute or minutes (such as a plasma immersion ion implantation step), this leaves very little time for the pre-process seasoning deposition step and the post-processing seasoning removal step. This time is too short for the heat exchangers 327 or 335-1 to change the temperature of the chamber walls or the ESC by any significant amount. Therefore, it is preferred to select a respective optimum temperature for each of the respective elements (i.e., the chamber walls, the ESC and the wafer), and hold these elements at their respective temperatures throughout processing. Accordingly, prior to chamber seasoning, the chamber sidewall is permanently set to its optimum temperature and the ESC is set to its optimum temperature. Upon introduction of the wafer, the ESC chucking voltage is set to a level that puts the wafer temperature at its optimum level, where it is held until the completion of wafer processing. The wall temperature and ESC temperature continue unchanged during removal of the seasoning film, in a preferred embodiment.

The processes described above for rapid pre-process deposition of a seasoning layer and post-process removal of the seasoning layer may be carried out in similar fashion in the RPS chamber 334. In this way, the RPS chamber interior surfaces may be coated with a seasoning layer prior to wafer processing in the main chamber 42 and the seasoning layer in the RPS chamber 334 may be removed upon completion of wafer processing in the main chamber 42.

Preferred Process Chemistries:

For plasma immersion ion implantation processes employing either a fluoride-based dopant gas (e.g., BF3) or a hydride-based dopant gas (e.g., PH3), it is preferred to employ a fluorocarbon polymer or hydrocarbon polymer, respectively. Although a fluoro-hydrocarbon polymer can be employed, it is preferred to not combine fluorine and hydrogen together in the same process, as their combination can promote etching of the wafer (and of consumable materials in the chamber interior) to an excessive degree. A fluorocarbon polymer is resistant or impervious to etching by a fluoride dopant gas, while a hydrocarbon polymer is resistant or impervious to etching by a hydride dopant gas. Such polymer films effectively prevent or nearly prevent metallic contamination of the wafer, even in the presence of very high energy ions such as may be required for ion implantation. Using the procedures described in the previous paragraph with a fluorocarbon seasoning layer and a BF3 dopant process gas at very high ion energy (6 KV to 8 KV bias voltage), we have achieved extremely low particle and surface metallic contamination counts on the wafer front side and back side (less than 0.05 particles of size greater than 0.1 um per square cm wafer area and less than 1E10 metal atoms/cm2, respectively) with a seasoning deposition time less than the ion implantation time and a seasoning removal time less than the ion implantation time.

While fluoride dopant process gases have a greater tendency to etch the wafer, hydride dopant gases have a greater tendency to deposit a film on the wafer. Such unwanted deposition can be reduced by increasing the wafer temperature. If such an increase in temperature is not desired, then the unwanted deposition can be reduced by introducing diluent gases during ion implantation, such as H2 or N2 or NH3 (which promotes etching of the deposited material) and He or Ar or Ne or Xe (which promotes ion bombardment of the deposited film). Oxygen may also be added in very small amount to control deposition, but excessive oxygen may cause oxidation of the Si surface. Fluorine-containing gas may be added to control deposition by introducing an etch component. The fluorine-containing gas may be a complimentary dopant fluoride of the same p-type or n-type dopant (ie. BF3 added to a B2H6 or B5H9 doping process, or PF3 or AsF3 or AsF5 added to a PH3 or AsH3 doping process) or may be another fluoride such as SiF4, GeF4, NF3, HF or F2. The relative amount of the fluoride is selected to be small enough to minimize Si loss of the surface being implanted.

While the foregoing describes the surface being implanted as being comprised of Si, it may alternatively be comprised of Ge or SiGe or other semiconductor material or other material.

The preferred gas chemistry for depositing the chamber seasoning film prior to a plasma immersion ion implantation step employing a fluoride dopant gas is C4F6 or C3F6. Other fluorocarbon gases include C2F4, C2F6, C3F8, C4F8 and C5F8. As noted above, fluoro-hydrocarbon polymers may be employed for the chamber seasoning layer, but it is preferred to avoid combining fluorine and hydrogen in the process because such a combination promotes etching to an excessive degree. The fluoride dopant gas may be any one of BF3, AsF5, AsF3, PF3. In addition, the fluorocarbon seasoning film may be used for plasma immersion ion implantation with a non-dopant fluoride process gas, such as F, SiF4, GeF4 and the like.

The preferred gas chemistry for depositing the chamber seasoning film prior to a plasma immersion ion implantation step with a hydride dopant gas is C3H6 or C4H6. Methane (CH4) can work but is not preferred because its high hydrogen content tends to depress its deposition rate. Other hydrocarbon process gases for this purpose include C2H2, C2H4, C2H6, C3H8, C4H8, C4H10, C5H12, C6H14. As noted above, fluoro-hydrocarbon polymers may be employed for the chamber seasoning layer, but it is preferred to avoid combining fluorine and hydrogen in the process because such a combination promotes etching to an excessive degree. The hydride dopant gas may be B2H6, B5H9, B10H14, PH3, AsH3 and the like. A hydrocarbon polymer is also useful as a chamber seasoning layer for non-dopant implantation species such as nitrogen or hydrogen. However, it is preferred to not use it with ion implantation of oxygen, because oxygen is an etchant of a carbon polymer.

If it is desired to use a carbon polymer in connection with an oxygen-containing process gas or in connection with plasma immersion ion implantation of oxygen, then the polymer seasoning layer can be hardened to resist attack by oxygen (or other species) by doping or enriching it with silicon or germanium. Thus, a fluorocarbon polymer precursor gas employed during chamber seasoning film deposition should be augmented with a silicon- or germanium-containing gas such as SiF4 or GeF4, but alternatively could be augmented with SiH4 or GeH4 or metallorganic Si or Ge sources. Similarly, the hydrocarbon polymer precursor gas employed during chamber seasoning film deposition should be augmented with a silicon- or germanium-containing gas such as SiH4 or GeH4, but alternatively could be augmented with SiF4 or GeF4 or metallorganic Si or Ge sources. Such a hardened polymer is not rapidly removed with an oxygen cleaning gas. Preferably, rapid removal of such a hardened polymer seasoning layer is accomplished by adding fluorine and/or hydrogen to the cleaning gas, which may therefore be a combination of two or more of oxygen, hydrogen and fluorine The cleaning process can be further hastened by striking a plasma in the chamber and applying a significant bias voltage to the wafer support pedestal to increase ion bombardment energy in the chamber. Cleaning using a plasma in the chamber does not require that the RPS source be used.

Seasoning may alternatively or additionally be performed using non carbon-based materials. For example, the chamber and/or ESC may be seasoned with a plasma process that uses the dopant hydride or fluoride gas that will be used in the subsequent plasma immersion ion implantation process. Alternatively the chamber and/or Esc may be seasoned with a combination of dopant and silicon-containing gas such as SiH4 or SiF4 or germanium-containing gas such as GeH4 or GeF4. Alternatively the chamber may be seasoned with compound of the dopant material, such as a dopant oxide, nitride, carbide, by using, for example, a plasma containing BF3 or B2H6 and O2, N2, or C3H6, respectively. Alternatively the chamber/ESC may be seasoned with a silicon, silicon-hydride, silicon-oxide, silicon-nitride, or silicon-oxynitride film using for example SiH4, SiH4 and H2, SiH4 and O2, SiH4 and N2, or SiH4 and O2 and N2, respectively. Alternatively or additionally, the chamber/ESC may be seasoned with a germanium, germanium-hydride, germanium-oxide, germanium-nitride, or germanium-oxynitride film using for example GeH4, GeH4 and H2, GeH4 and O2, GeH4 and N2, or GeH4 and O2 and N2, respectively.

Working Examples:

Plasma immersion ion implantation using a fluoride dopant gas (such as BF3) with a bias voltage of 1 kV can be carried out using ESC temperature in a range between −40 and +60 degrees C., the preferred range being between 0 and +40 degrees C., a chamber wall temperature in the range of 0 to 120 degrees C., the preferred range being 20 to 80 degrees C. If the bias voltage is increased to 8 kV, then the maximum ESC temperature decreases to 60 degrees C. and the preferred maximum ESC temperature decreases to 20 degrees C. The foregoing assumes that Si etching loss be limited to much less than 10 Angstroms. For a hydride dopant gas, the temperature range tends to be higher, because, compared to fluoride dopant gases, hydride dopant gases tend to etch less and promote more deposition: at 1 kV bias and 500 watt source power, the ESC temperature range is 0 to 80 degrees C., the preferred range being 20 to 60 degrees C. At 8 kV, a lower temperature is better, the range being decreased to −20 to 60 degrees C. and the preferred range being 0 to 40 degrees C. For implant processes involving either hydride or fluoride dopant gases at either a high (8 kV) or low (1 kV) bias, the chamber pressure range is 5 to 200 mT, the preferred range being 10 to 100 mT. For a high conformality implant profile, the pressure range is 50-200 mT, the preferred pressure range being 60-100 mT. For a low conformality implant profile, the pressure range is 5 to 45 mT, the preferred pressure range being 10-30 mT. The source power range is 50 W to 3 kW per reentrant conduit, the preferred range being 100 W to 1 kW. The ESC wafer clamping D.C. voltage (which determines the wafer temperature) is in the range of 100 to 1000 V, the preferred range being 200 to 400 V.

In one example of a low energy plasma immersion ion implantation process for implanting a crystalline Si wafer or preamorphized Si wafer with boron with a fluoride dopant gas, the RF bias voltage was 1 kV, the dopant gas was BF3 at a flow rate of 20 sccm, the ESC temperature was 5 degrees C., the chamber wall temperature was 60 degrees C., the source power was 500 watts for each reentrant conduit, the process chamber pressure was 15 mtorr, and the wafer clamping voltage on the ESC was 200 volts D.C. In this example, the bias voltage may be increased to 8 kV to transform the process into a higher energy process without changing the other parameters. An implant time of 20 seconds and an RF bias voltage of 2.85 KV on a preamorphized (80 keV Ge, 5E14/cm2) Si wafer yielded a sheet resistance of about 372 ohms/square, a retained dose of 4.5E15 atoms/cm3, and an annealed junction depth of about 430 angstroms (defined by a boron concentration at the 5E18/cm3) following a spike anneal at 1050 degrees C. The foregoing contrasts favorably with a beamline implant process implanting B+ at a dose of 3E15 atoms/cm2 at an energy of 500 eV, decelerated from 2 keV, which had a sheet resistance of 393 ohms/square and an annealed junction depth of about 425 angstroms with the same anneal.

As employed in the foregoing paragraph, the term preamorphization refers to a pre-ion implantation process of damaging a crystalline material with ion bombardment in order to reduce or prevent channeling during the subsequent ion implantation process. Preamorphization produces an amorphous structure over some depth profile (that is a function of the implanted specie mass, energy, dose and angle of incidence with respect to the surface, and of the material or mass and structure being implanted). It is often performed to improve the subsequent junction formation process, as an amorphous structure reduces or eliminates channeling of implanted ions, yielding a shallower junction with better abruptness than a crystalline material. The shallower junction with equivalent resistance can provide better device switching performance.

If the low energy ion implantation process for implanting a crystalline Si wafer or preamorphized Si wafer with boron is used with a hydride dopant gas such as B2H6, then the ESC temperature is increased to 25 degrees C. and the gas flow rate is decreased to 10 sccm. In addition a diluent gas flow of 90 sccm of He and 50 sccm of H2 is added. In this example, the bias voltage may be increased to 8 kV to transform the process into a high energy process without changing the other parameters. An implant time of 10 seconds and an RF bias voltage of 2.85 KV on a preamorphized Si wafer yielded a sheet resistance of about 353 ohms/square, a retained dose of 7.7E15 atoms/cm3, and an annealed junction depth of about 420 angstroms (defined by a boron concentration at the 5E18/cm3) following a spike anneal at 1050 degrees C.

In another example of a low energy plasma immersion ion implantation process for implanting a crystalline Si wafer or preamorphized Si wafer with boron with a fluoride dopant gas, the RF bias voltage was 1 kV, the dopant gas was BF3 at a flow rate of 20 sccm, the ESC temperature was 5 degrees C., the chamber wall temperature was 60 degrees C., the source power was 100 watts for each reentrant conduit, the process chamber pressure was 40 mtorr, and the wafer clamping voltage on the ESC was 200 volts D.C. In this example, the bias voltage may be increased to 8 kV to transform the process into a high energy process without changing the other parameters.

In another example of a low energy ion implantation process for implanting a crystalline Si wafer or preamorphized Si wafer with boron with a hydride dopant gas such as B2H6, then the ESC temperature is increased to 25 degrees C. and the gas flow rate is decreased to 10 sccm. In addition a diluent gas flow of 90 sccm of He and 50 sccm of H2 is added. The source power was 100 watts for each reentrant conduit, the process chamber pressure was 40 mtorr, and the wafer clamping voltage on the ESC was 200 volts D.C. In this example, the bias voltage may be increased to 8 kV to transform the process into a high energy process without changing the other parameters.

In the two preceding examples, increasing the chamber pressure may increase the conformality of the implantation. Alternatively, the processes may be carried out with 0 watts source power with some reduction in dose rate, or at 70 mtorr with little or no reduction in dose rate relative to the example at 100 watt and 40mtorr.

In one example of a low energy plasma immersion ion implantation process for implanting a wafer with a surface comprised of deposited film of 700 angstroms thickness of amorphous Si or polycrystalline Si over an oxide isolation layer of 40 angstrom thickness with boron with a fluoride dopant gas, the RF bias voltage was 2 kV, the dopant gas was BF3 at a flow rate of 20 sccm, the ESC temperature was 25 degrees C., the chamber wall temperature was 60 degrees C., the source power was 100 watts for each reentrant conduit, the process chamber pressure was 40 mtorr, and the wafer clamping voltage on the ESC was 200 volts D.C. Alternatively, the process may be carried out with 0 watts source power with some reduction in dose rate, or at 70 mtorr with little or no reduction in dose rate relative to the example at 100 watt and 40 mtorr. An implant time of 60 seconds yielded a Si layer sheet resistance of about 1200 ohms/square following a 20 second anneal at 960 degrees C., compared with a beamline implant process implanting B+ at a dose of 5E15 atoms/cm2 at an energy of 3 keV, which had a sheet resistance of 590 ohms/square with the same anneal. The RF bias voltage and implant time may be adjusted (up or down) to optimize the sheet resistance of the annealed Si layer thickness.

If the low energy ion implantation process for implanting a wafer with a surface comprised of deposited film of 700 angstroms thickness of amorphous Si or polycrystalline Si over an oxide isolation layer of 40 angstrom thickness with boron is used with a hydride dopant gas such as B2H6, then the ESC temperature is increased to 35 degrees C. and the gas flow rate is 10 sccm. In addition a diluent gas flow of 90 sccm of He and 50 sccm of H2 is added. The other parameters are kept about the same as the previous example. An implant time of 60 seconds yielded a Si layer sheet resistance of about 570 ohms/square following a 20 second anneal at 960 degrees C. The RF bias voltage and implant time may be adjusted (up or down) to optimize the sheet resistance of the annealed Si layer thickness.

In the preceding examples, increasing chamber pressure may increase the conformality of the implantation.

When implanting an isolated semiconductor layer as in the preceding two examples (implanting a wafer with a surface comprised of deposited film of amorphous Si or polycrystalline Si over an oxide isolation layer) where it is desired to dope the entire layer thickness to achieve a target resistivity after anneal (in contrast to forming a semiconductor pn junction), a combination of deposition and implantation may be advantageously combined to maximize the doping rate and resultant process throughput. The deposition component may be increased by selecting a dopant hydride gas rather than a fluoride, and one or more of the following: reducing the implant RF bias voltage, reducing the dilution gas flow, increasing the process chamber pressure, reducing the wafer temperature. A typical soak anneal (anneal time of seconds to tens of seconds or longer) is sufficient to diffuse the deposited and implanted dopant species throughout the layer thickness and activate the diffused dopant (to the solid solubility limit at the anneal temperature).

In one example of a low energy chamber seasoning process carried out prior to a plasma immersion ion implantation process using a fluoride dopant gas, the chamber seasoning process gas was the fluorocarbon gas C4F6 at a gas flow rate of 500 sccm. The ESC and chamber wall temperatures were the same as in the fluoride dopant ion implantation examples given above, the chamber pressure was 15 mT and the source power was 2000 watts applied at each reentrant conduit. The time required to season the chamber was about the same as the time required to perform the ion implantation process. In this example, the bias voltage may be increased to 8 kV to transform the process to a high energy process without changing the other parameters. The range of possible chamber pressure values in the chamber seasoning process is from 5 to 100 mT. The range of possible source power values in the chamber seasoning process is from 300 to 3000 Watts for each reentrant conduit. The range of gas flow rates in the chamber seasoning process is 100 to 2000 sccm.

In one example of a chamber seasoning process carried out prior to a plasma immersion ion implantation process using a hydride dopant gas, the chamber seasoning process gas was the hydrocarbon gas C3H6, and the process parameters were the same as in the previous example, except that the ESC temperature was 25 degrees C., and the bias voltage was 1 kV in a low energy version of the process and 8 kV in a high energy version of the process.

In one example of a chamber cleaning process for removing a fluorocarbon seasoning film from the chamber interior surfaces, the external RPS chamber was used to form a plasma from a cleaning gas and furnish dissociated neutrals of that gas to the main chamber. The cleaning gas included 90% oxygen and 10% hydrogen, introduced into the RPS chamber at a total flow rate of 2000 sccm, the hydrogen being helpful in removing dopant residue from the main chamber interior surfaces. The main chamber wall and ESC temperatures were the same as in the above examples involving fluoride chemistries, while the main chamber pressure was about 1 torr. The source power applied to the RPS plasma source was about 5000 Watts.

In one example of a cleaning process for removing a hydrocarbon seasoning film from the chamber interior surfaces using the external RPS source, all the process parameters were the same as above except that the ESC temperature was 25 degrees C. and the chamber wall temperature was 35 degrees C.

In one example of a chamber cleaning process for removing a fluorocarbon seasoning film from the chamber interior surfaces, plasma source power used to form a plasma from a cleaning gas within the main chamber 42. The cleaning gas included oxygen and hydrogen, each introduced into the RPS chamber 334 at a flow rate of 500 sccm, the hydrogen being helpful in removing dopant residue from the main chamber interior surfaces. The main chamber wall and ESC temperatures were the same as in the above examples involving fluoride chemistries, while the main chamber pressure was 15 mT. The source power was 1000 watts applied at each reentrant conduit 22a, 22b. Bias voltage up to about 1 kV may be added to accelerate cleaning of the polymer from the colder ESC surface.

In one example of a cleaning process for removing a hydrocarbon seasoning film from the chamber interior surfaces using a plasma formed within the main chamber, all the process parameters were the same as above except that the ESC temperature was 25 degrees C. and the chamber wall temperature was 35 degrees C.

One chamber cleaning process employing the multi-mode reactor is performed as follows:
1. A cleaning gas and an optional non-reactive gas are introduced through RPS 334.
2. Plasma is generated within RPS 334.
3. Plasma-generated species (which can include radicals and ions, as well as electrons) from the RPS 334 flow into the main chamber 42 (via showerhead).
4. A plasma is generated in the main process chamber 42 (for example by applying RF plasma source power or RF plasma bias power).
5. As a result the main chamber interior is cleaned. The purpose of applying bias power in the main chamber 42 is to increase the plasma potential (even of a weak plasma) to overcome thermal energy threshold limitations of the chemical reaction between cleaning species generated by the downstream source and deposited materials to be cleaned. The weak plasma with ion energies of ~10 eV to a few hundred eV allow cleaning at low temperature with very low etching of chamber and process kit materials. Contamination is prevented the same way that has been described above using a subsequent seasoning process.

The cleaning gas mix introduced into the RPS 334 can include one or more of NF3, O2, H2, N2, N2O, H2O which might be combined (optionally) with inert such as He, Ne, Ar, Xe.

One process example may be as follows: NF3 gas at a flow rate of 1000 sccm, O2 gas at a flow rate of 500 sccm and H2 gas at a flow rate of 100 sccm are provided to the RPS, with the RPS chamber pressure being around 500 mtorr to several torr (preferably 1 torr), the RPS plasma source power being about 5 KW, the main chamber pressure being about 50 to 250 (preferably 100) mtorr. It should be noted that the main chamber gas distribution showerhead drops the pressure between the RPS 334 and the main chamber 42. The chamber wall/ceiling temperature is about 60 degrees C., the ESC temperature is about 35 degrees C., and the bias voltage applied to the ESC is about 100-1000V (preferably 300V). This process cleans hydrocarbon or fluorocarbon seasoning polymer as well as deposition products of hydride or fluoride dopant and Si-based deposition in less time than the season time required, which is typically less time than the implant time required (e.g., 20 seconds to season, 20 seconds to implant, and 20 second to clean the chamber).

Another process example may be as follows: NF3 gas at a flow rate of 500sccm, and O2 gas at a flow rate of 100 sccm and H2 gas at a flow rate of 100 sccm are provided to the RPS, with the RPS chamber pressure being around 100 mtorr to about 800 mtorr (preferably about 400 mtorr), the RPS plasma source power being about 5 KW, the main chamber pressure being about 10 to 90 (preferably 30) mtorr. It should be noted that the main chamber gas distribution showerhead drops the pressure between the RPS 334 and the main chamber 42. The chamber wall/ceiling temperature is about 60 degrees C., the ESC temperature about 35 degrees C., and the source power was 1000 watts applied at each reentrant conduit 22a, 22b. This process cleans hydrocarbon or fluorcarbon seasoning polymer as well as deposition products of hydride or fluoride dopant and Si-based deposition in less time than the season time required, which is typically less time than the implant time required (e.g., 20 seconds to season, 20 seconds to implant, and 20 second to clean the chamber). Optionally, a bias voltage of 10-1000 volts (preferably about 100 volts) may be applied to the ESC to further reduce the cleaning time.

Another chamber cleaning process employing the multi-mode reactor in a sequential manner is performed as follows:
1. A cleaning gas and an optional non-reactive gas are introduced through RPS 334.
2. Plasma is generated within RPS 334.
3. Plasma-generated species (which can include radicals and ions, as well as electrons) from the RPS 334 flow into the main chamber 42 (via showerhead), partially cleaning the main chamber interior surfaces.
4. The same or different cleaning gas and optional non-reactive gas are introduced into the main chamber.
5. Plasma source or bias power is applied to generate a plasma in the main chamber, further cleaning the main chamber.
6. The above sequence is optionally repeated until the main chamber is clean. Alternatively the sequence of cleaning using the RPS source and the plasma source may be reversed.

A process example of the above-described sequential cleaning process may be as follows: First, plasma source power was used to form a plasma from a cleaning gas within the main chamber 42. The cleaning gas included oxygen and hydrogen, each introduced into the RPS chamber 334 at flow rates of 500 and 100 sccm, respectively, the hydrogen being helpful in removing dopant residue from the main chamber interior surfaces. The main chamber wall and ESC temperatures were 60 and 35 degrees C., respectively, while the main chamber pressure was 20 mT. The source power was 1000 watts applied at each reentrant conduit 22a, 22b. Bias voltage of about 100-1000 volt may be added to accelerate cleaning of the polymer from the colder ESC surface. Second, the RPS source is used to clean the chamber surfaces in the following process: NH3 gas at a flow rate of 2000 sccm is provided to the RPS, with the RPS chamber pressure being around 500 mtorr to about 5 torr (preferably about 2 torr), the RPS plasma source power being about 5 KW, the main chamber pressure being about 100 mtorr to several torr (preferably about 500 mtorr). It should be noted that the main chamber gas distribution showerhead drops the pressure between the RPS 334 and the main chamber 42. The chamber wall/ceiling temperature is about 60 degrees C. and the ESC temperature is about 35 degrees C. as in the foregoing examples. This sequential process cleans hydrocarbon or fluorcarbon seasoning polymer as well as deposition products of hydride or fluoride dopant and Si-based deposition in less time than the season time required, which is typically less time than the implant time required (e.g., 20 seconds to season, 20 seconds to implant, and 20 seconds total to clean the chamber). Optionally the sequence may be reversed.

The RPS chamber 334 produces plasma-generated species for delivery through the gas distribution showerhead into the main chamber 42. These plasma-generated species can include radicals and other excited species, and may include reactive species and/or non-reactive species.

Deposited Layer Doping:

A common doping process is the doping of a deposited layer of semiconductor material over a dielectric material. This structure is commonly used in MOS transistors for example, in memory devices. A deposited layer of amorphous or polycrystalline silicon is deposited over a thermally grown SiO2 material on a silicon substrate. The SiO2 layer is the gate dielectric and the amorphous or polycrystalline silicon layer is the gate electrode or bit line in the completed transistor. (Note that other gate dielectrics may be used). Typically a conventional beamline implanter is used to implant boron ions (B+), for example, to a depth within the deposited layer of amorphous or polycrystalline silicon. The layer may be masked or unmasked, depending on the application and process sequence. The workpiece or substrate is stripped and cleaned after implant, if necessary, then subsequently annealed to (1) diffuse the dopant material across the thickness of the amorphous or polycrystalline silicon deposited layer, (2) crystallize the layer to at least a limited degree, and to (3) activate the dopant (replace silicon atoms in a crystal lattice), producing a conductive gate and/or line. Diffusion of the dopant across the thickness of the layer to the gate interface is important, as any poorly doped region will yield a high series resistance. Furthermore, when the gate is biased in actual operation with an electric field, a lower resistance at the gate dielectric interface provides for a reduced depletion region width (region of poor conductivity under high electric field). A low series resistance and a minimum depletion region width is required for optimum device speed and switching performance. To achieve low series resistance and minimum depletion region width with the constraint that the implanted dose not penetrate too far, (i.e., into the gate dielectric) requires a high dopant dose at relatively low energy. (i.e., B+, 5E15 atoms/cm2, 3 keV). Beamline implanters' productivity fall off at low energy, and the high dose requirement compounds the productivity problem. Decelerated beams ("decel mode") typically cannot be used to enhance productivity because energy contamination (from energetic neutral species) can penetrate the gate dielectric and adversely affect device performance. Implantation of molecular species such as BF2+, which yield higher beam currents, typically cannot be used to enhance productivity because the presence of fluorine at or near the gate dielectric may adversely affect device performance as well.

Plasma doping can be used to increase the productivity (numbers of wafers processed per hour) of the above-described doping application. The plasma doping can be carried out in a plasma immersion ion implantation process of the type described above in which the dopant species is implanted within the workpiece with a desired depth profile (i.e., within the deposited silicon layer). Preferably, however, the doping is carried out at a lower bias voltage so that dopant species from the plasma deposit in a film formed on the surface of the deposited silicon layer. Once a desired dose is achieved, the workpiece is annealed as described above in order to diffuse the dopant materials through the entire thickness of the deposited silicon layer. This diffusion ensures high dopant concentration and activation throughout the thickness of the deposited silicon layer, including up to the silicon/oxide interface where it is so important to attain a low sheet resistance to minimize depletion in this region. Alternatively, the bias voltage may be slightly increased so that, while some of the dopant material is deposited on the silicon layer surface, other dopant material is implanted beneath the surface at a relatively shallow depth. The reactor chamber pressure is adjusted according to whether dopant deposition or dopant implantation is desired. Dilution gas such as hydrogen may also be added to control or reduce deposition.

Preferably, the workpiece support is an electrostatic chuck (ESC), which is used to electrostatically attract the workpiece to the top surface of the ESC to facilitate heat transfer between workpiece and the ESC. The ESC is preferably temperature controlled (or is coupled to a temperature controlled surface) to maintain approximately constant temperature, even as the heat load on the workpiece (and ESC) varies with the application of power. The ESC may be heated or cooled. The ESC may be of the conventional type that employs a heat transfer gas between esc and workpiece to increase the thermal coupling (heat transfer coefficient). Preferably, however, the ESC is a high contact force gasless cooling ESC of the type disclosed above with reference to FIG. 1. The workpiece temperature is controlled through the ESC and is set below a deposition threshold temperature (if a dopant deposition layer is desired) and above a deposition threshold temperature (if ion implantation is desired). The workpiece temperature (through the ESC) is preferably set below the etch threshold temperature (to prevent significant etching of the workpiece surface). For processes that use a photoresist mask, the workpiece temperature is also maintained below a maximum temperature limitation of the photoresist mask.

A dopant gas (such as BF3 or B2H6) is introduced to the vacuum chamber and chamber pressure is preferably controlled to a target level. If some deposition is desired, then preferably a hydride gas such as B2H6 is used.

Some applications may benefit from operating the workpiece at an elevated temperature to maintain deposited layer structure or morphology which provides for improved activation and lower resistance. Selection of hydride dopants may provide improved (lower) resistance in such cases.

RF power is applied to generate a plasma. RF is advantageously used (as compared with DC or pulsed DC) because RF power will couple across insulating layers on workpiece, insulating layers on the ESC, and across insulating films that accumulate on chamber walls, all without a significant voltage drop. This provides a great advantage over D.C. coupled plasma processes. Plasma generated from a DC source (including pulsed D.C.) depends upon surface interactions with energetic ions, and therefore D.C. coupled plasmas are susceptible to large variations as insulating films accumulate on chamber walls. They are also susceptible to losses across insulating layers on the workpiece and/or the ESC. In an RF-powered plasma, plasma is generated by either an oscillating RF sheath coupling to electrons, or by directly coupling an RF electric field to electrons. RF is also more efficient than D.C. in producing plasma, allowing operation at lower voltage and lower pressure than DC would allow. Preferably, some (or all) of the RF power may be applied as bias power through the ESC. Alternatively or additionally, some of the RF power may be applied as plasma source power.

P-N Junction formation:

For forming P-N junctions, such as the source or drain contact or extensions of a MOSFET used in a logic device, ion implantation is preferred (rather than dopant deposition and subsequent diffusion or annealing). This is because the highly abrupt and extremely shallow junction profile required for MOSFET source and drain extensions can best be attained by implanting dopant species with a depth profile corresponding to the depth of the desired junction, and then minimizing (or nearly preventing) any diffusion during the subsequent dopant activation anneal step. Ideally a diffusionless anneal such as laser anneal is used, but other anneal processes such as spike anneals can be used as well. In the case where a spike anneal is used (not diffusionless), the dopant species are implanted with a depth profile corresponding to a depth selected to be less than the desired final junction depth, such that the final spike annealed junction will have the requisite depth. Preamorphizing the region to be implanted prior to dopant implantation may be performed to maximize junction abruptness.

Such a plasma immersion ion implantation process has been described in detail in the related Pat. applications referenced above.

Fluoride or hydride dopant gases may be used to form p-n junctions in a plasma immersion ion implantation process.

Pressure may be selected to be lower to minimize angular distribution of ion velocities for a non-conformal or less conformal implant profile, or higher to maximize angular distribution of ion velocities for a more conformal implant profile, such as for implanting three dimensional structures (ie. FIN-FET transistors).

RF power is advantageously used to generate the plasma for the same reasons described above.

Briefly, such processes maintain the workpiece temperature (through the ESC) above the deposition threshold temperature (to prevent significant deposition on the workpiece surface during ion implantation) while applying sufficient bias power to set the ion implant depth to the desired junction depth. Such processes preferably also maintain the workpiece temperature (through the ESC) below the etch threshold temperature (to prevent significant etching of the workpiece surface during ion implantation) while applying sufficient bias power to set the ion implant depth to the desired junction depth. For high dose implantation it is important to prevent excessive etch loss because such loss can limit the maximum possible dose attainable. For implant processes that use a photoresist mask, the workpiece temperature is also maintained below a maximum temperature limitation of the photoresist mask. Some applications may benefit from operating the workpiece at sufficiently high temperature to reduce amorphization (above 100 degree C.) or maintain crystallinity (above 500-600 degree C.) while performing implantation. Selection of hydride dopants may provide improved sheet resistance at the requisite junction depth in such cases.

The ESC therefore can serve both as the agent for controlling the workpiece temperature and as the RF power applicator for RF bias power applied to the workpiece and coupled to the plasma.

In addition to deposited layer doping and P-N junction formation, other applications may benefit from utilizing the ESC as the agent for controlling the workpiece temperature and as the RF power applicator for RF bias power applied to the workpiece and coupled to the plasma. Surface modification processes such as implantation or nitridation of gate dielectric materials, work function modification of metal gate materials by implantation, and surface cleaning with hydrogen are examples where workpiece temperature must be controlled while modifying the workpiece suface by plasma ion bombardment.

In the foregoing description of the RPS 334, the term "excited neutrals" refers to products of the RPS that include uncharged atoms or molecules that have a higher internal energy (i.e., higher than the "ground state" for that specie) attributable to, for example, an inelastic collision with another particle (typically an energetic electron) or due to absorption of a photon of sufficient energy. The excited state may be stable or metastable (short-lived) before relaxing to a lower energy state and emitting a photon. Inelastic collisions between electrons and neutrals or ions can result in excitation reactions, dissociation reactions and ionization reactions (including dissociative ionization reactions).

In some applications, the bias voltage required may be relatively high, as is the case in plasma immersion ion implantation processes for a relatively deep implant depth. In such cases, it is difficult to attain a low implant dosage because the dose rate is so high. If a low accurately defined dosage is required in such a process, then the dose rate is preferably reduced by pulsing the applied RF power at a pulse rate and duty cycle that produces a desirably reduced implant dose rate. This approach is particularly simple and effective if the only (or the predominant) plasma-generating power is a plasma RF bias generator coupled to the wafer support pedestal, since only this single RF generator needs to be pulsed in order to attain a desirably reduced implant dose rate.

While the invention has been described in detail by specific reference to preferred embodiments, it is understood that variations and modifications thereof may be made without departing from the true spirit and scope of the invention.

What is claimed is:

1. A method of processing a workpiece, comprising:
providing a main reactor chamber having a ceiling gas distribution plate facing a wafer support and side gas injectors below said gas distribution plate, and providing a remote source chamber enclosed separately from the main reactor chamber;
evacuating said main reactor chamber and evacuating said remote source chamber;
placing a wafer on said wafer support in said main chamber and, while said wafer is on said wafer support, providing a plasma in said main chamber having ions that impinge on said wafer by introducing a process gas through said side gas injectors in said main reactor chamber and applying RF power to external transverse reentrant conduits having chamber entry ports on opposite sides of said main reactor chamber, so as to produce an oscillating plasma current in a closed reentrant path that encircles said gas distribution plate;
increasing dissociation of species in said main reactor chamber independently of said RF power, by generating a remote plasma in said remote source chamber and introducing through said ceiling gas distribution plate excited radicals from said remote plasma into said main reactor chamber.

2. The method of claim 1 further comprising:
prior to placing the wafer on the support, depositing a seasoning film on interior surfaces of said main reactor chamber by generating an seasoning oscillating plasma current in said closed reentrant path with a seasoning species gas.

3. The method of claim 2 further comprising:
after placing the wafer on said wafer support but before generating the plasma of reactive species in said main reactor chamber, performing a wafer clean step by generating a plasma of wafer cleaning species in said remote source chamber and introducing radicals of the wafer cleaning species from the remote source chamber into the main chamber to clean undesired materials from said wafer.

4. The method of claim 3 further comprising:
generating the plasma of reactive species in said main reactor chamber within a sufficiently short time following completion of said wafer clean step to prevent regrowth of native oxide on said wafer.

5. The method of claim 1 further comprising:
coupling RF bias power to the wafer of a sufficient power level to perform plasma immersion ion implantation of a species derived from said process gas to a desired implant depth.

6. The method of claim 5 further comprising:
controlling the temperature of the wafer by clamping the wafer to the wafer support by generating an electrostatic wafer clamping force in the wafer support, and regulating the temperature of the wafer by regulating the electrostatic wafer clamping force.

7. The method of claim 6 further comprising:
providing a polished continuous wafer support surface on said wafer support uninterrupted by open channels;
prior to placing the wafer on the wafer support, depositing a cushioning layer on said wafer support surface.

8. The method of claim 7 wherein depositing a cushioning layer is performed while maintaining the wafer support surface at a temperature conducive for deposition of said cushioning film, so as to deposit said cushioning film on said wafer support surface and not on other interior surfaces of said main chamber.

9. The method of claim 2 further comprising:

during the deposition of the seasoning film, maintaining the interior surfaces of said main chamber at a temperature conducive for depositing said seasoning film;

depositing a cushioning layer on a wafer support surface of said wafer support while maintaining a wafer support surface of said wafer support at a temperature conducive for deposition of said cushioning film, so as to deposit said cushioning film on said wafer support surface and not on other interior surfaces of said main chamber.

10. A method of processing a workpiece, comprising:

providing a main reactor chamber having a ceiling gas distribution plate facing a wafer support and side gas injectors below said gas distribution plate, and providing a remote source chamber enclosed separately from the main reactor chamber;

evacuating said main reactor chamber and evacuating said remote source chamber;

placing a wafer on said wafer support in said main chamber and, while said wafer is on said wafer support, generating a plasma in said main chamber having ions that impinge on said wafer by introducing a process gas through said side gas injectors in said main reactor chamber and applying RF power to external transverse reentrant conduits having chamber entry ports on opposite sides of said main reactor chamber, so as to produce an oscillating plasma current in a closed reentrant path that encircles said gas distribution plate;

regulating the proportion of reactive ions to reactive radicals independently of said RE power, by generating a remote plasma in said remote source chamber and introducing through said ceiling gas distribution plate reactive radicals from said remote plasma into said main reactor chamber.

11. The method of claim 10 further comprising:

prior to placing the wafer on the support, depositing a seasoning film on interior surfaces of said main reactor chamber by generating an seasoning oscillating plasma current in said closed reentrant path with a seasoning species gas.

12. The method of claim 11 further comprising:

after placing the wafer on said wafer support but before generating the plasma of reactive species in said main reactor chamber, performing a wafer clean step by generating a plasma of wafer cleaning species in said remote source chamber and introducing radicals of the wafer cleaning species from the remote source chamber into the main chamber to clean undesired materials from said wafer.

13. The method of claim 12 further comprising:

generating the plasma of reactive species in said main reactor chamber within a sufficiently short time following completion of said wafer clean step to prevent regrowth of native oxide on said wafer.

14. The method of claim 10 further comprising:

coupling RF bias power to the wafer of a sufficient power level to perform plasma immersion ion implantation of a species derived from said process gas to a desired implant depth.

15. The method of claim 14 further comprising:

controlling the temperature of the wafer by clamping the wafer to the wafer support by generating an electrostatic wafer clamping force in the wafer support, and regulating the temperature of the wafer by regulating the electrostatic wafer clamping force.

16. The method of claim 15 further comprising:

providing a polished continuous wafer support surface on said wafer support uninterrupted by open channels;

prior to placing the wafer on the wafer support, depositing a cushioning layer on said wafer support surface.

17. The method of claim 16 wherein depositing a cushioning layer is performed while maintaining the wafer support surface at a temperature conducive for deposition of said cushioning film, so as to deposit said cushioning film on said wafer support surface and not on other interior surfaces of said main chamber.

18. The method of claim 11 further comprising:

during the deposition of the seasoning film, maintaining the interior surfaces of said main chamber at a temperature conducive for depositing said seasoning film;

depositing a cushioning layer on a wafer support surface of said wafer support while maintaining a wafer support surface of said wafer support at a temperature conducive for deposition of said cushioning film, so as to deposit said cushioning film on said wafer support surface and not on other interior surfaces of said main chamber.

* * * * *